(12) United States Patent
Nakamura et al.

(10) Patent No.: US 11,064,144 B2
(45) Date of Patent: Jul. 13, 2021

(54) IMAGING ELEMENT, IMAGING APPARATUS, AND ELECTRONIC EQUIPMENT

(71) Applicant: SONY CORPORATION, Tokyo (JP)

(72) Inventors: Masahiko Nakamura, Kanagawa (JP); Norihiko Akamatsu, Tokyo (JP)

(73) Assignee: SONY CORPORATION, Tokyo (JP)

( * ) Notice: Subject to any disclaimer, the term of this patent is extended or adjusted under 35 U.S.C. 154(b) by 117 days.

(21) Appl. No.: 16/301,904

(22) PCT Filed: May 23, 2017

(86) PCT No.: PCT/JP2017/019144
§ 371 (c)(1),
(2) Date: Nov. 15, 2018

(87) PCT Pub. No.: WO2017/212909
PCT Pub. Date: Dec. 14, 2017

(65) Prior Publication Data
US 2019/0289235 A1 Sep. 19, 2019

(30) Foreign Application Priority Data
Jun. 6, 2016 (JP) .............................. JP2016-112845

(51) Int. Cl.
*H01L 27/146* (2006.01)
*H04N 5/369* (2011.01)
(Continued)

(52) U.S. Cl.
CPC ........... *H04N 5/36961* (2018.08); *G02B 7/34* (2013.01); *G03B 13/36* (2013.01); *H01L 27/146* (2013.01);
(Continued)

(58) Field of Classification Search
None
See application file for complete search history.

(56) References Cited

U.S. PATENT DOCUMENTS

2007/0237511 A1 10/2007 Kusaka
2012/0249846 A1 10/2012 Nishio et al.
(Continued)

FOREIGN PATENT DOCUMENTS

JP 2007-279312 A 10/2007
JP 2012-215785 A 11/2012
(Continued)

OTHER PUBLICATIONS

Office Action for JP Patent Application No. 2018-522407, dated Mar. 30, 2021, 6 pages of Office Action and 7 pages of English Translation.

*Primary Examiner* — Jack S Chen
(74) *Attorney, Agent, or Firm* — Chip Law Group

(57) ABSTRACT

The present technology relates to an imaging element, an imaging apparatus, and electronic equipment which are capable of accurately detecting phase difference. The imaging element includes a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions. The technique disclosed herein is applicable to imaging apparatuses having the autofocusing function.

13 Claims, 19 Drawing Sheets

(51) Int. Cl.
  *H04N 9/04*   (2006.01)
  *G02B 7/34*   (2021.01)
  *G03B 13/36*   (2021.01)
  *H04N 9/07*   (2006.01)
  *H04N 5/232*   (2006.01)

(52) U.S. Cl.
  CPC .. *H01L 27/14605* (2013.01); *H01L 27/14621* (2013.01); *H01L 27/14623* (2013.01); *H01L 27/14627* (2013.01); *H04N 5/369* (2013.01); *H04N 5/379* (2018.08); *H04N 9/0455* (2018.08); *H04N 9/07* (2013.01); *H04N 5/232122* (2018.08)

(56) References Cited

U.S. PATENT DOCUMENTS

2015/0222834 A1  8/2015 Nishio et al.
2019/0289235 A1* 9/2019 Nakamura ........ H01L 27/14621

FOREIGN PATENT DOCUMENTS

JP  2016-082133 A  5/2016
JP  2016-099432 A  5/2016
WO 2016/063727 A1  4/2016

\* cited by examiner

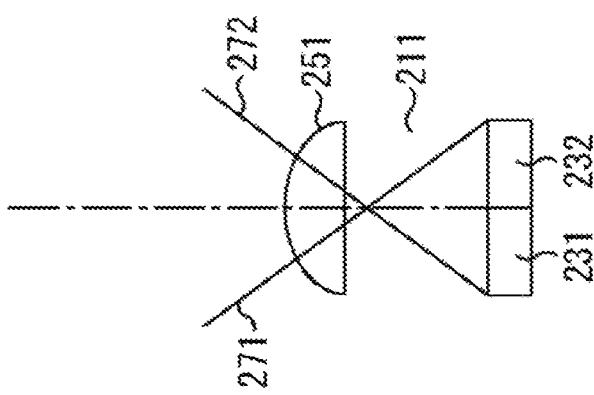
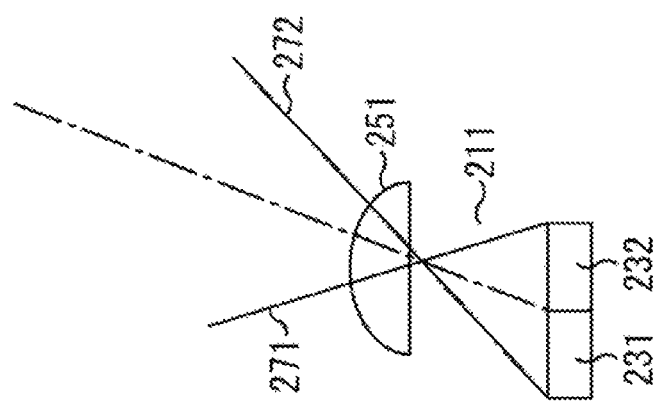
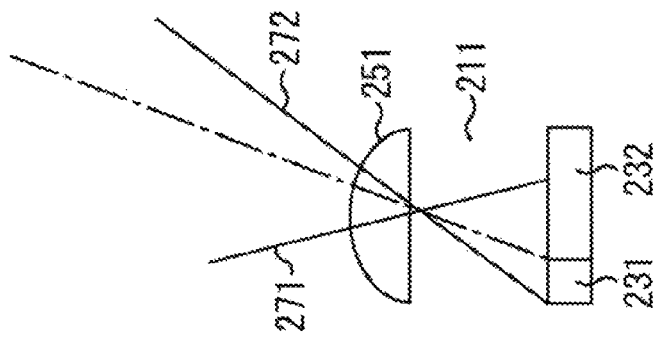

IMAGING ELEMENT, IMAGING APPARATUS, AND ELECTRONIC EQUIPMENT

CROSS REFERENCE TO RELATED APPLICATIONS

This application is a U.S. National Phase of International Patent Application No. PCT/JP2017/019144 filed on May 23, 2017, which claims priority benefit of Japanese Patent Application No. JP 2016-112845 filed in the Japan Patent Office on Jun. 6, 2016. Each of the above-referenced applications is hereby incorporated herein by reference in its entirety.

TECHNICAL FIELD

The present technology relates to an imaging element, an imaging apparatus, and electronic equipment. To be more specific, the present technology relates to an imaging element, an imaging apparatus, and electronic equipment which are capable of detecting focus points more accurately than before.

BACKGROUND ART

The digital camera relies on the autofocus mechanism, which falls under that of contrast system and that of phase detection system. The contrast system achieves focusing by moving the lens to find the focus point where the image has a highest contrast. This autofocusing method does not need additional optical system because it achieves its object by simply reading out a part of the image on the imaging element.

By contrast, the phase detection system relies on the technique of triangulation; it is designed to obtain the distance from the difference between two angles each of which arises from two different points subtending the same subject. The phase detection system employs two images of light fluxes passing through two different parts of a lens (or two light fluxes passing through the right and left sides of a lens). The phase detection system gives the amount of distance over which the lens should move to the focus position.

There is another type of autofocus system called the image surface phase detection autofocus system which performs autofocusing by the phase detection system with the help of the imaging element. This autofocus system employs the imaging element provided with microlenses for light convergence and apertures to control the amount of light entering these microlenses (see PTL 1, for example).

There is another way of realizing the image surface phase detection autofocus system as disclosed in PTL 2. According to this disclosure, the object is achieved by dividing one imaging element into two or more parts and causing each part to function as an element for focus detection.

CITATION LIST

Patent Literature

[PTL 1]
 JP 2011-165736A
[PTL 2]
 JP 2001-250931A

SUMMARY

Technical Problems

The system proposed in PTL 1 has the disadvantage that the shaded pixel is so poor in sensitivity as to give an output high enough for its ordinary photographing purpose. Moreover, it requires that the pixels for phase detection to be used as imaging pixels also need to have their signals amplified to a certain level. Otherwise, the pixels for phase detection needs to have their values interpolated with signals from their surrounding ordinary pixels.

Because of the foregoing, it is not practicable for the imaging sensor to have a large number of pixels for phase detection embedded therein which would deteriorate the quality of the photographed image. This makes it difficult to improve the accuracy of focus detection.

By contrast, the system proposed in PTL 2 has the advantage that all the pixels can be used as both pixels for phase detection and ordinary pixels without adverse effects on the accuracy of focus detection and the quality of photographed images. On the other hand, it has the disadvantage that all the pixels should be divided in equal size so that they have uniform characteristic properties.

It has another disadvantage of requiring adjustments for microlens and pixel size so that the imaging sensor catches incident light flux efficiently at the positions away from the optical center to cope with the fact that the incoming beam varies in angle depending on positions (close to and away from the center). According to PTL 2, this difficulty is circumvented by dividing all the pixels in equal size, which creates another problem with adjusting pixel size to regulate discrepancy in angles of incident rays.

The present technology was completed in view of the foregoing. It is intended to provide an imaging sensor which is capable of capturing incident light flux efficiently regardless of the angle of incident rays, thereby improving the accuracy of phase detection.

Solution to Problems

One aspect of the present technology is directed to an imaging element including a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

One aspect of the present technology is directed to an imaging apparatus including an imaging element having a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

One aspect of the present technology is directed to electronic equipment including an imaging element having a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

The imaging element according to one aspect of the present technology has a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

The imaging apparatus according to one aspect of the present technology includes the imaging element.

The electronic equipment according to one aspect of the present technology includes the imaging element.

Advantageous Effect of Invention

The imaging element according to one aspect of the present technology is capable of capturing incident light flux efficiently regardless of the angle of incident ray, and hence is capable of performing more accurate phase detection.

Note that the effect of the present technology is not restricted to those mentioned above but includes any effect mentioned in this disclosure.

BRIEF DESCRIPTION OF DRAWINGS

FIGS. 10A, 10B, and 10C are diagrams to explain the pixel arrangement that depends on the incident angle.

DESCRIPTION OF EMBODIMENTS

The modes of the present technology (referred to embodiments hereinafter) will be described below.

<Configuration of Imaging Apparatus>

The technology mentioned herein is applicable to the autofocus mechanism for digital cameras or the like. In particular, the present technology is applicable to the phase detecting system, which is one of the autofocus systems including that of contrast detection system and that of phase detection system. The following description is concerned with the image surface phase detecting autofocus system.

The image surface phase detecting autofocus system is applicable to most electronic equipment which is provided with semiconductor packages for image capturing parts (or photoelectric converting parts). They include imaging apparatuses such as digital still cameras and video cameras, portable terminals such as cellular phones having a photographing function, and copying machines which employ an imaging apparatus for image reading.

Figure 1:
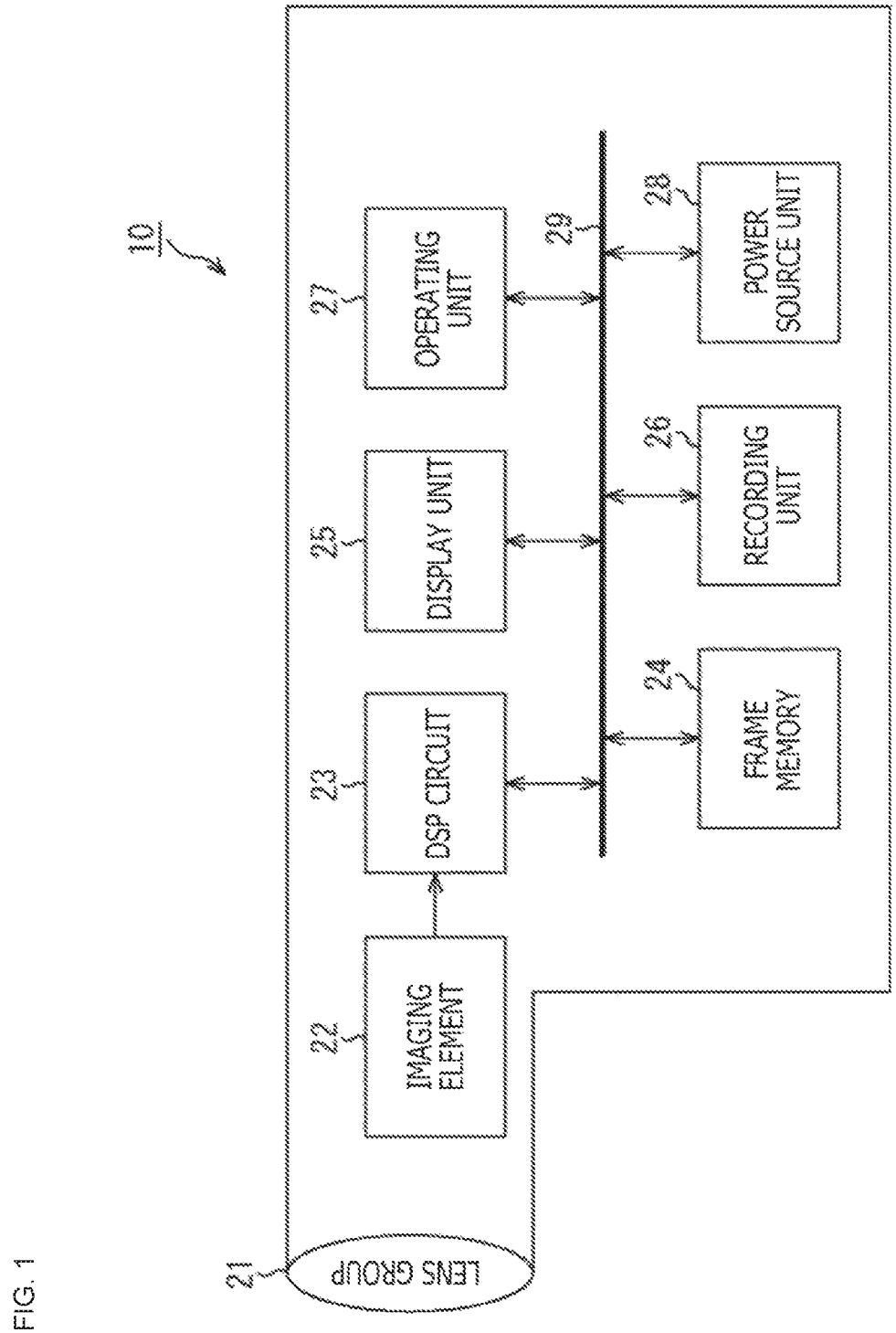
FIG. 1 is a block diagram depicting the configuration of an imaging apparatus.

The electronic equipment, such as imaging apparatus, pertaining to the present technology has the configuration as illustrated in FIG. 1, which is a block diagram. As depicted in FIG. 1, an imaging apparatus 10 according to the present technology includes an optical system including lens group 21, an imaging element (imaging device) 22, a DSP (Digital Signal Processor) circuit 23, a frame memory 24, a display unit 25, a recording unit 26, an operating unit 27, and a power source unit 28. The DSP circuit 23, the frame memory 24, the display unit 25, the recording unit 26, the operating unit 27, and the power source unit 28 are connected to one another thorough a bus line 29.

The lens group 21 captures incident light (image light) from the subject and causes them to form an image on the surface of the imaging element 22. The imaging element 22 converts the image, which has been formed on its surface by the lens group 21, into electrical signals for each pixel according to the amount of incident light, and the resulting electrical signals are output in the form of pixel signals.

The DSP circuit 23 processes the signals received from the imaging element 22. For example, the imaging element 22 has pixels to detect the focus point and the DSP circuit 23 processes signals from such pixels, thereby detecting the focus point, detailed description will be given later. In addition, the imaging element 22 has pixels that constitute an image of the photographed subject, and the DSP circuit 23 processes signals from such pixels, thereby developing the processed signals in the frame memory 24.

The display unit 25 is a panel-type display device, such as liquid-crystal display device or organic EL (electroluminescence) display device. It displays dynamic images or still images which have been photographed by the imaging element 22. The recording unit 26 records in a recording medium the dynamic or still images which have been captured by the imaging element 22.

The operating unit 27 issues instructions for various functions possessed by the imaging apparatus in response to the user's operation. The power source unit 28 supplies electric power to the DSP circuit 23, the frame memory 24, the display unit 25, the recording unit 26, and the operating unit 27.

The imaging apparatus constructed as mentioned above can be used for video cameras and digital still cameras or as camera modules for mobile instruments (such as portable phones). The imaging apparatus mentioned above contains the imaging element 22 which is a semiconductor package based on the phase detecting pixels explained below.

<Constitution of Imaging Element>

Figure 2:
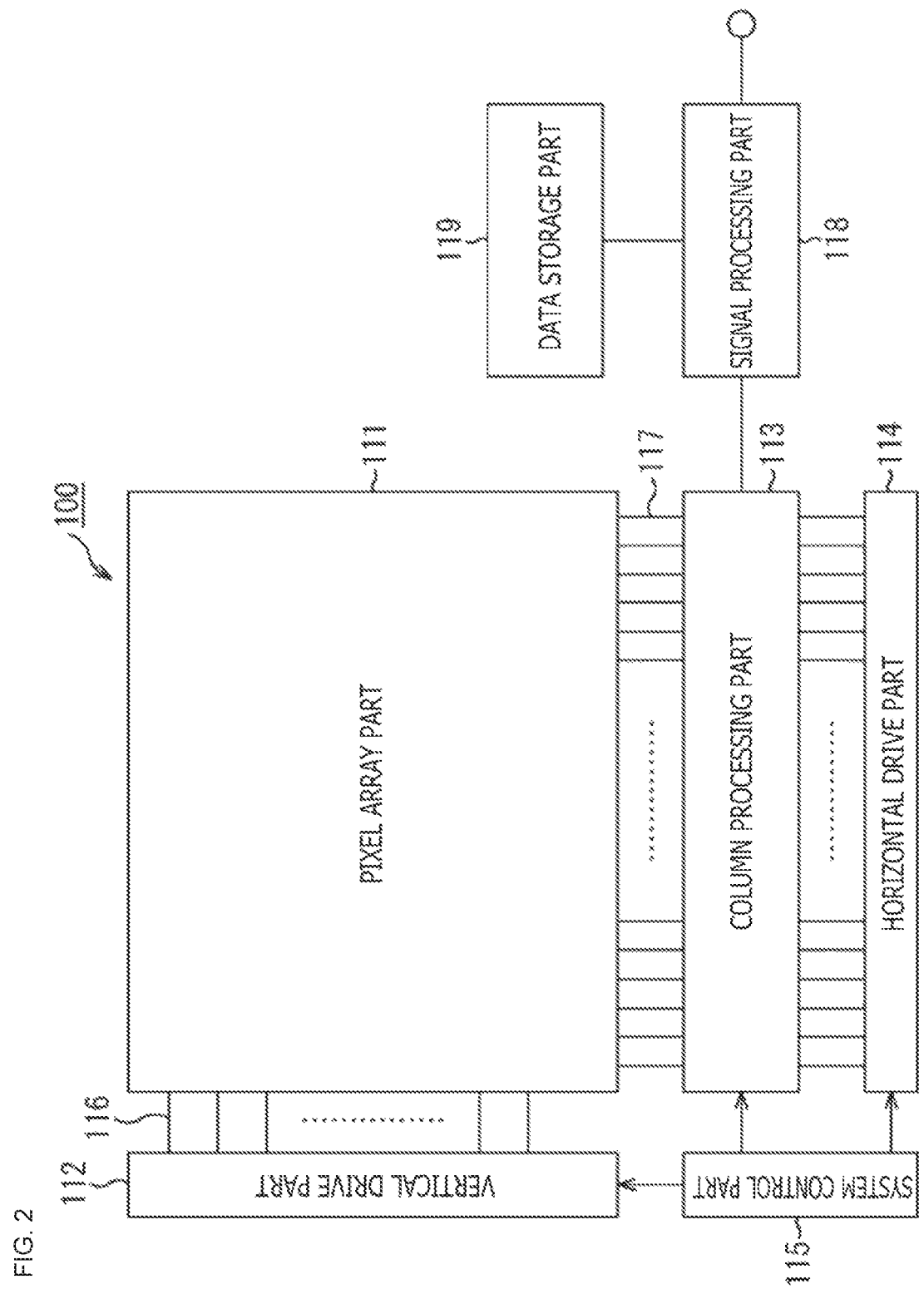
FIG. 2 is a diagram depicting the constitution of an imaging element.

The imaging element 22 is constructed as schematically depicted in FIG. 2. It is a CMOS image sensor, which is one of the imaging apparatuses of X-Y addressing type. The CMOS image sensor is one which is based entirely or partly on the CMOS process.

A CMOS image sensor 100 depicted in FIG. 2 is composed of a pixel array part 111, which is formed on a semiconductor substrate (not depicted), and a peripheral circuit part, which is integrated on the same semiconductor substrate as used for the pixel array part 111. The peripheral circuit part is composed of a vertical drive part 112, a column processing part 113, a horizontal drive part 114, and a system control part 115.

The CMOS image sensor 100 additionally has a signal processing part 118 and a data storage part 119. The signal processing part 118 and the data storage part 119 may be mounted on the substrate which is common to or separate from that for the CMOS image sensor 100. The signal processing part 118 and the data storage part 119 may perform their processing with the help of an external signal processing part, such as DSP (Digital Signal Processor) circuit, (which is formed separately from the CMOS image sensor 100), or with the help of software.

The pixel array part 111 is composed of unit pixels each having a photoelectric converting part that generates and stores electric charge in response to the amount of light received (the unit pixels may occasionally be referred to simply as "pixel" hereinafter). The pixels are arranged in the row direction and the column direction or arranged in the form of two dimensional matrix. Incidentally, the row direction denotes the horizontal direction in which the pixels are arranged, and the column direction denotes the vertical direction in which the pixels are arranged.

The pixel array part 111, in which the pixels are arranged in the matrix pattern, has pixel drive lines 116, each arranged in the row direction for each pixel row. It also has vertical signal lines 117, each arranged in the column direction for each pixel column. The pixel drive line 116 transmits drive signals for driving to read out signals from the pixels. Although the pixel drive line 116 is depicted as a single line in FIG. 1, the drive line is not necessarily limited to one. The pixel drive line 116 has its one end connected to the output terminal corresponding to each row of the vertical drive part 112.

The vertical drive part 112 is composed of shift registers and address decoders, and it drives the pixels of the pixel array part 111 all at once or by the unit of column. In other words, the vertical drive part 112 constitutes not only the system control part 115 that controls the vertical drive part 112 but also the drive part that drives individual pixels in the pixel array part 111. The vertical drive part 112 is usually composed of two scanning systems, one for reading and the other for sweeping (illustration for detail structure is omitted here).

The scanning system for reading reads signals from unit pixels by sequentially reading the unit pixels in the pixel array part 111 row by row. The signals which have been read out from the unit pixels are analog signals. The scanning system for sweeping performs sweeping on the row to be read out by the scanning system for reading in advance of the scanning for reading as much as the shutter speed.

The scanning for sweeping by the scanning system for sweeping sweeps out unnecessary charge from the photoelectric converting some of the unit pixels in the reading row, thereby resetting the photoelectric converting part. The sweeping (or resetting) of unnecessary charge by the scanning system for sweeping performs the so-called electronic shutter action. The term "electronic shutter action" used herein denotes an action to discard photoelectric charge from the photoelectric converting part and newly start exposure (or start accumulation of photoelectric charge).

The signals which have been read out as the result of reading action by the scanning system for reading correspond to the amount of light received after the immediately preceding reading action or the electronic shutter action. The interval between the reading timing due to the immediately preceding reading action or the sweeping timing due to the electronic shutter action and the reading timing due to the latest reading action determines the exposure period for photoelectric charge in the unit pixel.

The vertical drive part 112 selectively scans the pixel rows and yields signals from each unit pixel. The resulting signals are entered into the column processing part 113 through the vertical signal lines 117 for each pixel column. The column processing part 113 performs prescribed signal processing on signals output through the vertical signal lines 117 for each pixel column in the pixel array part 111. It also temporarily retains the pixel signals which have undergone signal processing.

To be concrete, the column processing part 113 performs signal processing which includes at least noise removal processing, such as CDS (Correlated Double Sampling). The CDS processing by the column processing part 113 removes reset noise and fixed pattern noise inherent to the pixel, such as variation in the threshold value of the amplifying transistor in the pixels. The column processing part 113 may have the AD (analog-digital) conversion function in addition to the noise removing function, so that it will convert analog pixel signals into digital pixel signals to be output later.

The horizontal drive part 114 is composed of shift registers and address decoder, so that it sequentially selects the unit circuits corresponding to the pixel column of the column processing part 113. The selective scanning by the horizontal drive part 114 causes the pixel signals which have undergone for individual circuits in the column processing part 113 to be output sequentially.

The system control part 115 includes the timing generator that generates various kinds of timing signals. The timing signals generated by the timing generator control the driving of the vertical drive part 112, the column processing part 113, and the horizontal drive part 114.

The signal processing part 118 has at least the arithmetic processing function, so that it performs various kinds of signal processing (such as arithmetic processing) on the pixel signals output from the column processing part 113. The data storage part 119 temporarily stores data necessary for signal processing by the signal processing part 118.

<Pixel Arrangement According to the First Embodiment>

Figure 3:
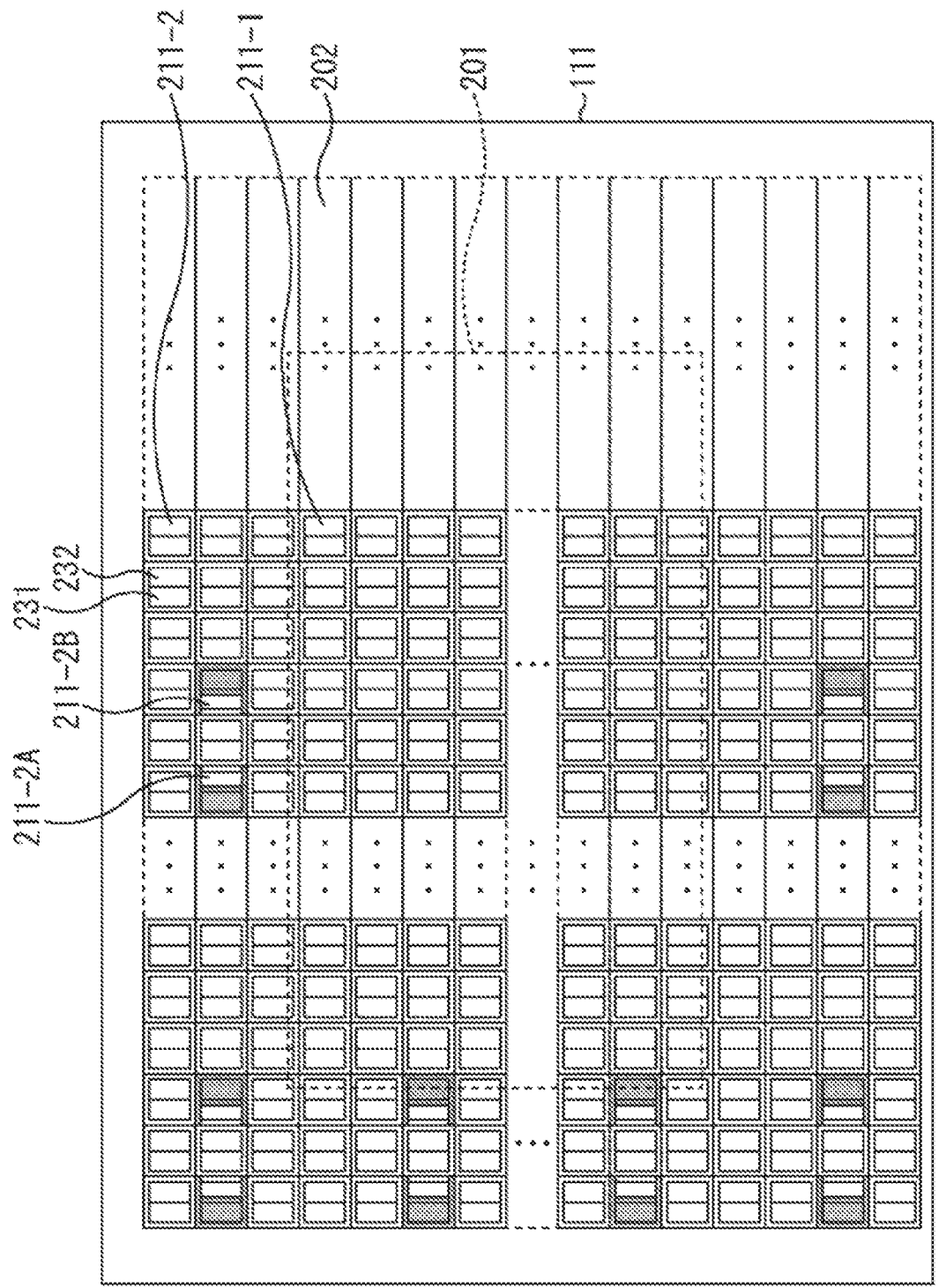
FIG. 3 is a diagram illustrating the arrangement of pixels according to a first embodiment.

According to the first embodiment of the present technology, the pixel array part 111 is composed of the pixels which are arranged as depicted in FIG. 3. The pixel array part 111 is composed of unit pixels (simply referred to as "pixels" hereinafter), each having the photoelectric converting part which generates and accumulates photoelectric charge in response to the amount of light received. The pixels are arranged in the row direction and the column direction, or in the two-dimensional matrix pattern.

The following description of the pixel array part 111 is divided into two sections, one dealing with the region close to the optical center (referred to as the central region 201 hereinafter) and the other dealing with the region away from the optical center (referred to as the peripheral region 202 hereinafter).

Assuming that the pixel array part 111 has a long side of 25 nm, the central region 201 will cover 5 nm at the center and the peripheral region 202 will cover 20 nm (excluding the center). In other words, the central region 201 occupies equal to or more than 20% of the pixel array part 111 and the peripheral region 202 occupies equal to or less than 80% of the pixel array part 111. Note that the numerical values given here are merely exemplary and are not restrictive.

Each pixel 211 in the pixel array part 111 is composed of two light-receiving regions as explained later with reference to FIG. 4. The central region 201 has the pixels 211-1 arranged therein, and the peripheral region 202 has the pixels 211-2 arranged therein. Each of the pixels 211-1 and 211-2 has the light-receiving region.

The central region 201 and the peripheral region 202 differ from each other in the manner of phase detection. In the central region 201, one pixel 211 has two light-receiving regions, which detect the phase difference by means of the amount of light received by them. This method will be referred to as the divided pixel method hereinafter, which will be explained later with reference to FIG. 7.

In the peripheral region 202, one pixel 211 is divided into two light-receiving regions, which are partly shaded. The amount of light received by one set of two light-receiving regions is compared with the amount of light received by the other set of two light-receiving regions so that the phase difference is detected. This method is referred to as the shaded pixel method hereinafter. This method will be described later with reference to FIGS. 8 and 9.

<Structure of One Pixel>

The structure of the pixel 211 is described below. FIG. 4 is a view depicting a plan layout of the pixel 211 and FIG. 5 is a view depicting sectional view of the pixel 211.

One pixel 211 includes two light-receiving regions, the first being the light-receiving region 231 and the second being the light-receiving region 232. In other words, the pixel 211 is divided into the light-receiving region 231 and the light-receiving region 232. The light-receiving region 231 and the light-receiving region 232 are covered with one on-chip lens 251. In other words, each pixel is provided with one on-chip lens 251.

The pixel 211 includes two light-receiving regions 231 and 232 as mentioned above receives incident light as depicted in FIG. 5. In FIG. 5, a symbol 271 denotes the light flux passing through the region called the view point A, and a symbol 272 denotes the light flux passing through the region called the view point B.

The light flux 271 coming from the view point A enters the light-receiving region 232 through the on-chip lens 251. Likewise, the light flux 272 coming from the view point B enters the light-receiving region 231 through the on-chip lens 251.

The light-receiving region 231 yields image data based on the light flux coming from the view point B, and the light-receiving region 232 yields image data based on the light flux coming from the view point A. These data allow detection of defocus amount after correlative computation. The detected defocus amount allows detection of focus point as the optical system is changed into a desirable mode.

Also, the pixel 211 is made to function as an ordinary imaging pixel by using (adding) together the image data (for the light flux coming from the view point B) which is given by the light-receiving region 231 and the image data (for the light flux coming from the view point A) which is given by the light-receiving region 232. In other words, the pixel 211 functions not only as a pixel for phase detection but also as an ordinary imaging pixel.

Figure 4:
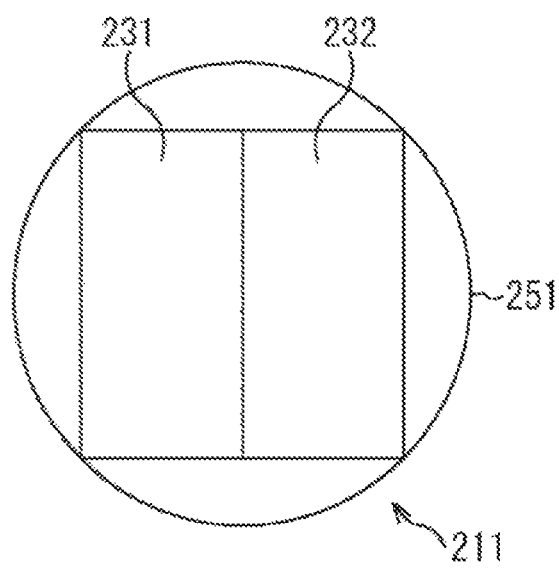
FIG. 4 is a diagram (plan view) depicting the structure of a divided pixel.
Figure 5:
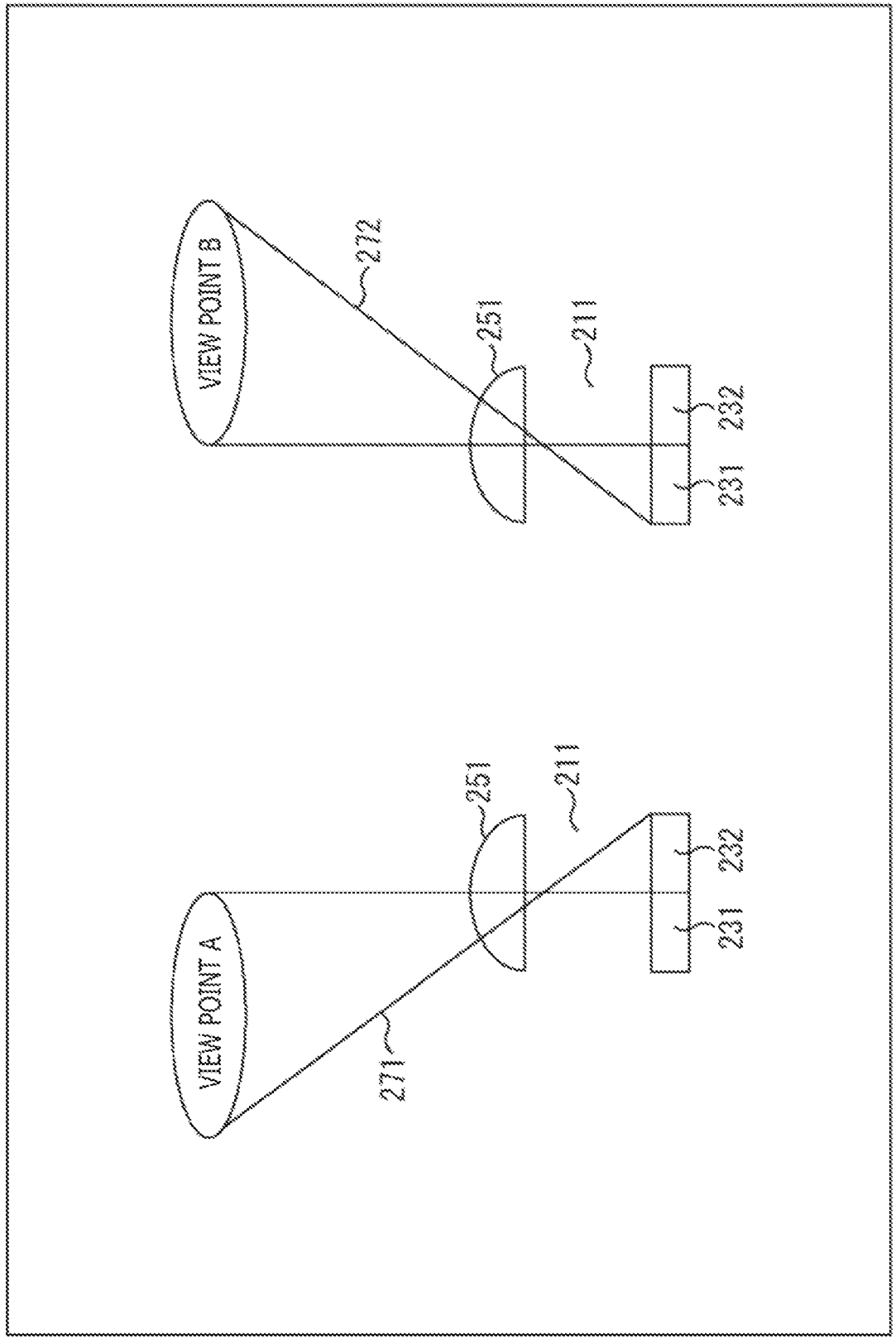
FIG. 5 is a diagram to explain the phase detection by a divided pixel method.
Figure 6:
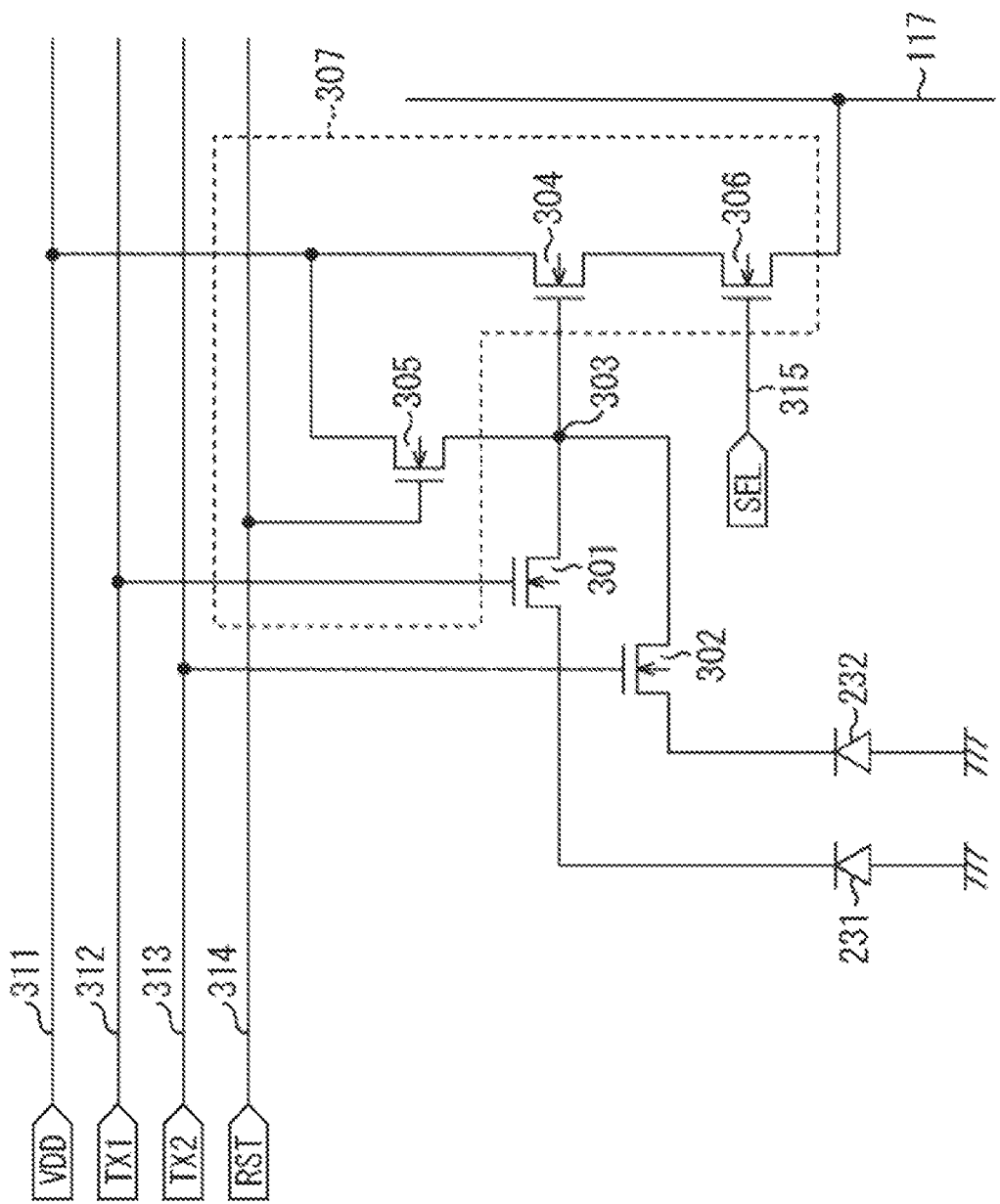
FIG. 6 is a circuit diagram of the pixel.

The pixel 211 depicted in FIGS. 4 and 5 is represented by the equivalent circuit depicted in FIG. 6. The light-receiving region 231 has a transfer transistor 301 connected thereto, and the light-receiving region 232 has a transfer transistor 302 connected thereto. There is an FD (floating diffusion) part 303, which is a diffusion region for both the light-receiving region 231 and the light-receiving region 232.

The light-receiving regions 231 and 232 generate and accumulate charge (signal charge) in proportion to the amount of light received. In addition, the light-receiving regions 231 and 232 have their anode terminals grounded and have their cathode terminals connected to the FD part 303 through the transfer transistors 301 and 302.

The transfer transistor 301 is turned on by the transfer signal TX1 which is supplied through the signal line 312, so that it reads out the charge which has been generated by the light-receiving region 231 and transfers it to the FD part 303. In addition, the transfer transistor 302 is turned on by the transfer signal TX2 which is supplied through the signal line 313, so that it reads out the charge which has been generated by the light-receiving region 232 and transfers it to the FD part 303.

The FD part 303 holds the charge read out from the light-receiving regions 231 and 232. A reset transistor 305 resets the potential of the FD part 303 because the charge stored in the FD part 303 is discharged to the drain (constant voltage source Vdd) when it is turned on by the reset signal RST supplied from the signal line 314.

An amplifying transistor 304 outputs to the FD part 303 the pixel signal proportional to potential. In other words, the amplifying transistor 304 constitutes the source-follower circuit together with the load MOS (not depicted) which functions as the constant-current source which is connected through the vertical signal line 117, so that it outputs the pixel signal (which represents the level corresponding to the charge accumulated in the FD part 303) to the vertical signal line 117 from the amplifying transistor 304 through a selective transistor 306.

The selective transistor 306 gets turned on when the pixel 211 is selected by a selecting signal SEL which has been supplied through the signal line 315, and then it outputs the pixel signal of the pixel 211 to the vertical signal line 117.

The embodiment represented by the foregoing equivalent circuit may be constructed such that a read-out circuit 307 is made common to the two light-receiving regions and it is possible to select the result from the either of the light-receiving regions depending on the decision to transfer to the FD part 303 which result of photoelectric conversion in the light-receiving regions 231 and 232. In the case where the sum of the results of photoelectric conversion by the light-receiving regions 231 and 232 is output, the foregoing structure may be modified such that both of the transfer transistors are activated and the charges which have been accumulated in the two light-receiving region are summed up in the diffusion region.

Incidentally, the pixel 211 constructed as mentioned above is merely exemplary and is not intended to restrict the scope of the present technology.

A plurality of the pixel 211 explained with reference to FIGS. 4 to 6 are arranged in the central region 201 and the peripheral region 202 of the pixel array part 111. In other words, the pixel array part 111 has a plurality of the pixel 211 arranged therein, each consisting of the light-receiving region 231 and the light-receiving region 232.

The pixels 211-1 which are arranged in the central region 201 of the pixel array part 111 function not only as the pixels for ordinary photographing but also as the pixels for phase detection.

The pixels 211-2 which are arranged in the peripheral region 202 of the pixel array part 111 function as the pixels for ordinary photographing. In addition, some of the pixels 211-2 arranged in the peripheral region 202 of the pixel array part 111 differ in structure from the foregoing ones so that they function as the pixels for phase detection.

<Divided Pixel Method>

The following is a detailed description of the pixel 211-1 which is arranged in the central region 201 of the pixel array part 111. It is supplemented with the phase detection which is accomplished by the pixel division in the pixel 211-1.

Figure 7:
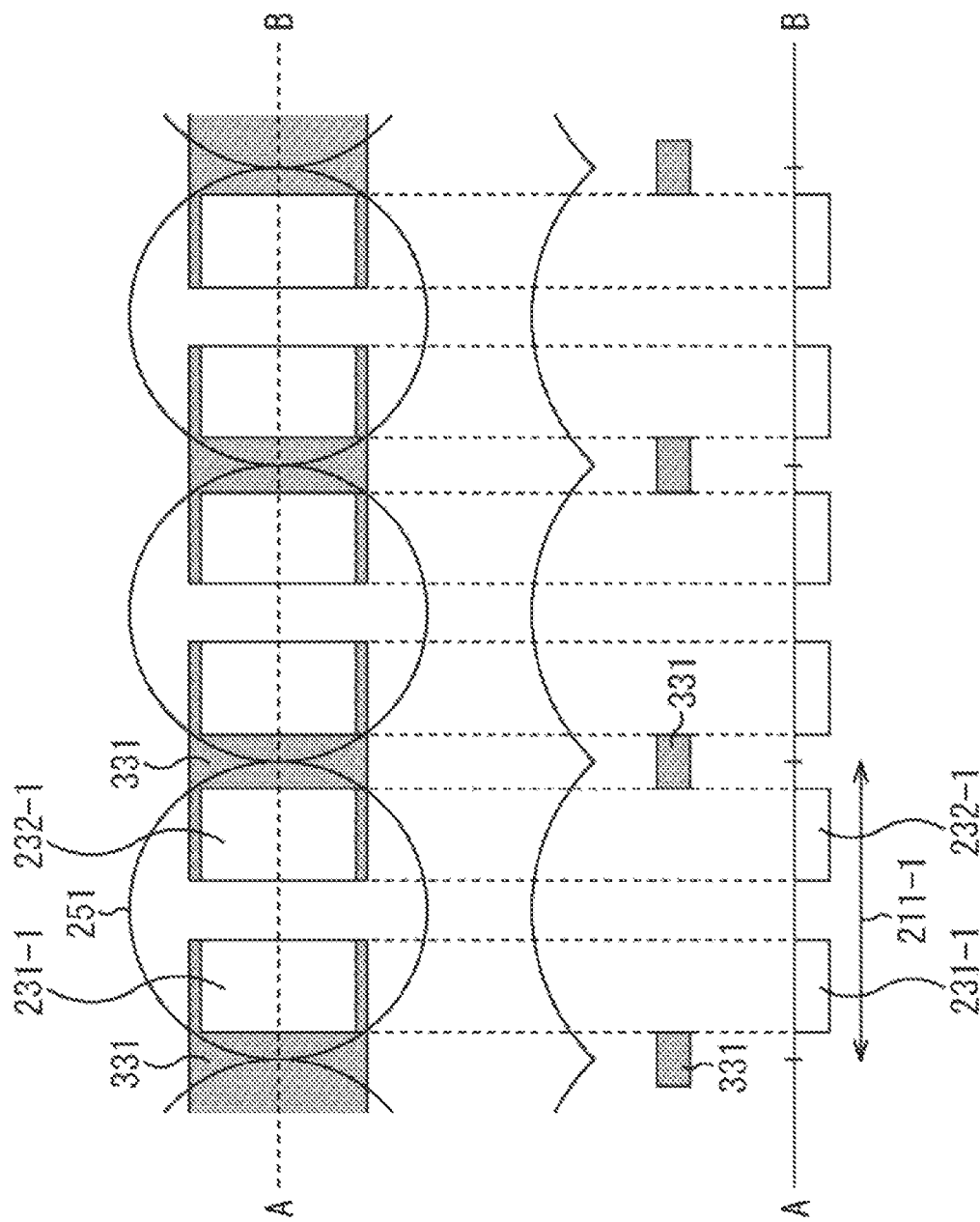
FIG. 7 is a diagram (plane view and sectional view) depicting the pixel for phase detection by the divided pixel method.

FIG. 7 is a plan view and a sectional view of the pixel 211-1. The upper part of FIG. 7 is a plan view and the lower part of FIG. 7 is a sectional view of the pixel 211-1. FIG. 7 depicts three adjacent pixels 211.

The upper part of FIG. 7 is a plan view depicting the pixel 211-1. This plan view is basically identical with that of the pixel 211 depicted in FIG. 4 except that the shading film 331 is added. The lower part of FIG. 7 is a sectional view depicting the pixel 211-1. This sectional view is also basically identical with that of the pixel 211 depicted in FIG. 5 except that the shading film 331 is added.

As depicted in FIG. 7, the on-chip lens 251 is so formed as to cover the light-receiving regions 231-1 and 232-1, and the shading film 331 is arranged so that it does not cover the light-receiving regions 231-1 and 232-1. Moreover, the shading film 331 is not formed between the light-receiving region 231-1 and the light-receiving region 232-1. The sectional view taken along the line A-B in the plan view (the upper part of FIG. 7) is depicted in the lower part of FIG. 7. Identical parts are given identical numbers throughout the two views.

The shading film 331 formed in the pixels 211-1 prevents light from leaking into its adjoining pixels 211-1. In addition, the pixel 211-1 constructed as depicted in FIG. 7 produces the effect of causing the light flux entering through the left part of the on-chip lens 251 to impinge on the light-receiving region 232-1 and the light flux entering through the right part of the on-chip lens 251 to impinge on the light-receiving region 231-1, as explained above with reference to FIG. 5.

The image data obtained from the light-receiving region 231-1 and the image data obtained from the light-receiving region 232-1 are used to detect the defocus amount after correlative computation. Moreover, the defocus amount permits focus detection after appropriate adjustment of the optical system.

The fact that the pixel 211-1 has the light-receiving regions 231-1 and 232-1 as mentioned above makes it possible to detect the phase difference with the help of the data obtained from the light-receiving regions. That is, the one pixel 211-1 is able to perform phase detection.

<Shaded Pixel Method>

What follows is a detailed description of the pixel 211-2 which is arranged in the peripheral region 202 of the pixel array part 111. It is supplemented with a description of the phase detection which is accomplished by the pixel 211-2 of shaded pixel method.

The phase detection is accomplished by a pair of the pixels 211-2 in the peripheral region 202. Reference will be made again to FIG. 3. The pair consists of the pixel 211-2A and the pixel 211-2B, as depicted in FIG. 3. There are arranged several sets of the paired pixels 211-2 in the peripheral region 202, as depicted in FIG. 3.

The paired pixels 211-2A and 211-2B are intended for phase detection and are not usually used for ordinary photographing. However, the paired pixels 211-2A and 211-2B can be used for ordinary photographing if they are given the subsequent stage for signal amplification, for example.

The pixels 211-2 in the peripheral region 202 are identical in structure with the pixels 211-1 in the central region 201 and they function as pixels for ordinary photographing, except for those which are used for phase detection.

It follows, therefore, that the pixels in the peripheral region 202 include those for phase detection and those for ordinary photographing. Also, the phase detection is accomplished by two of the pixel 211-2 which are paired.

Figure 8:
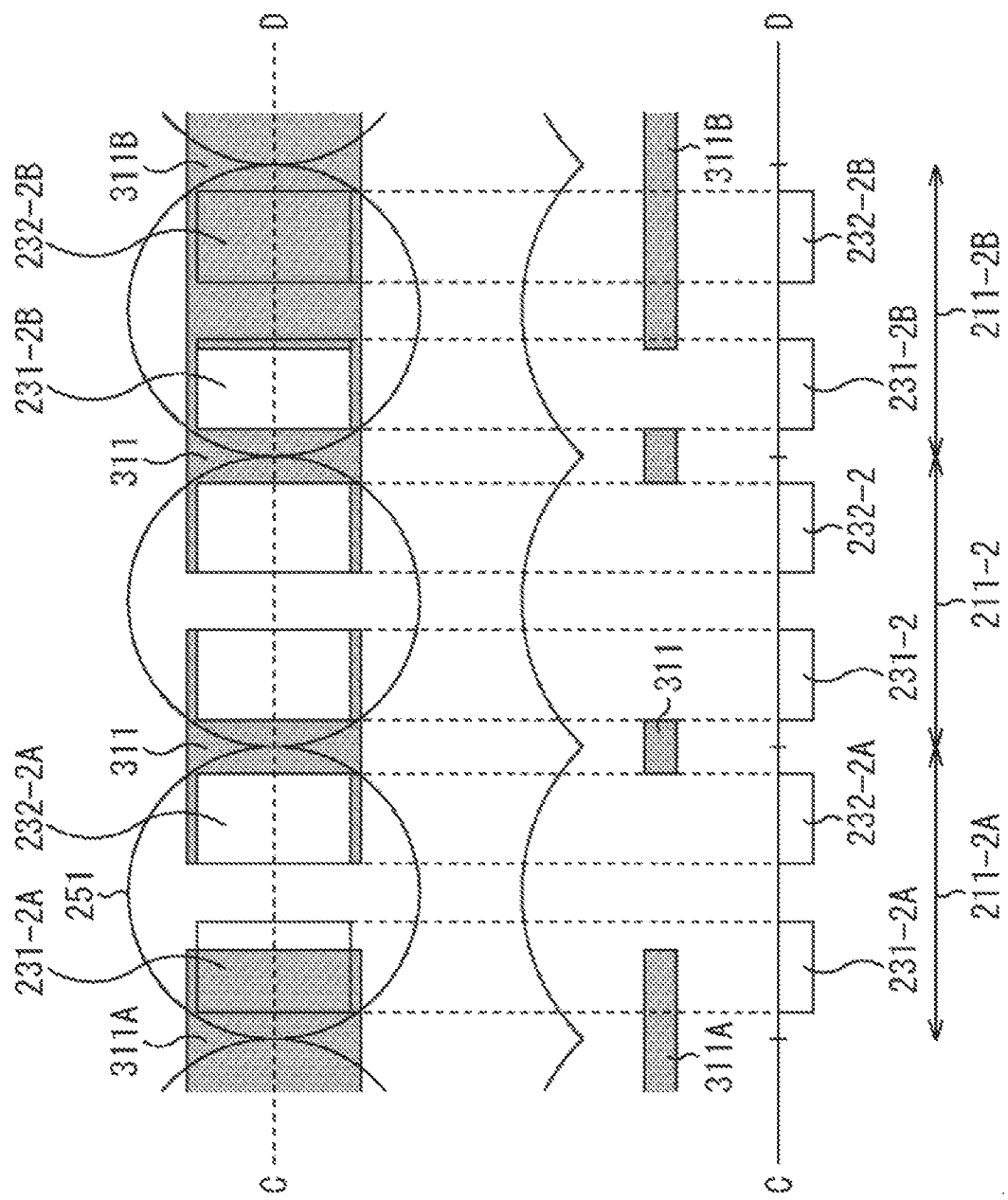
FIG. 8 is a diagram (plane view and sectional view) depicting the pixel for phase detection by a shaded pixel method.

FIG. 8 depicts three pixels (extracted from FIG. 3) including a pair of pixels 211-2 which are intended for phase detection. FIG. 8 also depicts a plan view and a sectional view of the pixel 211-2. The upper part of FIG. 8 is a plan view and the lower part of FIG. 8 is a sectional view of the pixel 211-2.

The pixel 211-2 depicted in the upper part (plan view) of FIG. 8 is basically identical in structure with the pixel 211-1 depicted in FIG. 7; however, they differ from each other in the length of the shading film 331 stretching across the pixel for phase detection. The pixel 211-2 depicted in the lower part (sectional view) of FIG. 8 is basically identical in structure with the pixel 211-1 depicted in FIG. 7, except for the length of the shading film 331 across the pixel for phase detection.

In FIG. 8 the pixel 211-2 (for ordinary photographing) is positioned at the center and the pixels 211-2A and 211-2B (for phase detection) are positioned at the left and right sides of the pixel 211-2.

The pixel for phase detection consists of the paired pixels 211-2 as mentioned above; in the case depicted in FIG. 8, this is accomplished by the pixel 211-2A at the left side and the pixel 211-2B at the right side which are paired together.

The pixel 211-2A includes the light-receiving region 231-2A and the light-receiving region 232-2A. The left one of these two light-receiving regions 231-2A and 232-2A is partly shaded to keep out light.

The pixel 211-2B includes the light-receiving region 231-2B and the light-receiving region 232-2B. The right one of these two light-receiving regions 231-2B and 232-2B is partly shaded to keep out light.

As mentioned above, the pixel 211-2, one of the paired phase detecting pixels, has its left side shaded, and the pixel 211-2, the other of the paired phase detecting pixels, has its right side shaded. The partly shaded two pixels 211-2 are exposed to light as depicted in FIG. 9.

Figure 9:
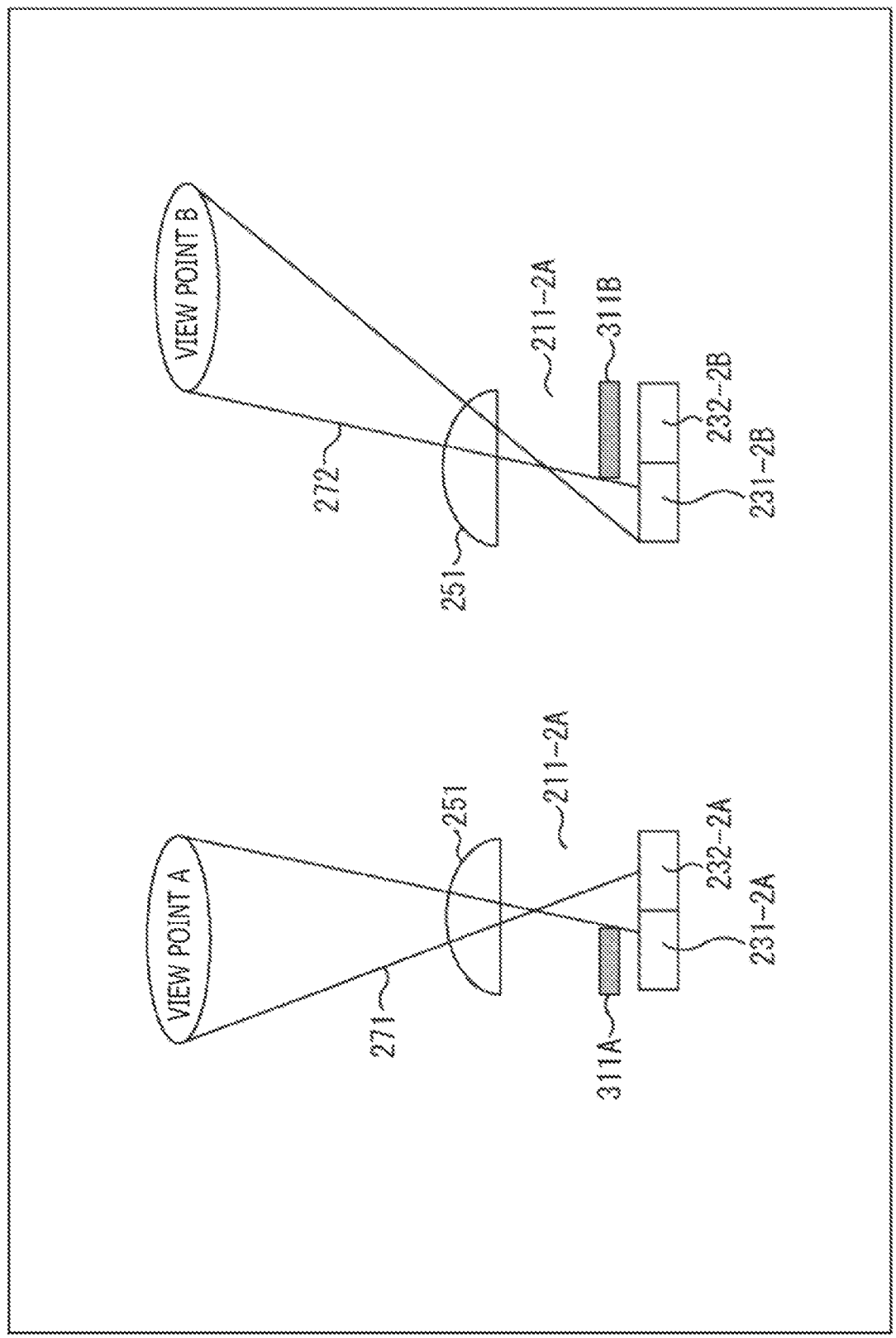
FIG. 9 is a diagram to explain phase detection by the shaded pixel method.

FIG. 9 depicts the light flux (with the symbol 271) which passes through the region called the view point A. FIG. 9 also depicts the light flux (with the symbol 272) which passes through the region called the view point B.

The light flux 271 emanating from the view point A impinges on the light-receiving regions 231-2A and 232-2A through the on-chip lens 251 placed on the pixel 211-2A. However, since the pixel 211-2A has its left side shielded by a shading film 311A, the light flux emanating from the view point B (or the right side of the pixel 211-2A) does not impinge on the light-receiving regions 231-2A and 232-2A.

Likewise, the light flux 272 emanating from the view point B impinges on the light-receiving regions 231-2B and 232-2B through the on-chip lens 251 placed on the pixel 211-2B. However, since the pixel 211-2B has its right side shielded by a shading film 311B, the light flux emanating from the view point A (or the left side of the pixel 211-2B) does not impinge on the light-receiving regions 231-2B and 232-2B.

As mentioned above, the pixel 211-2A receives light from the view point A, and the pixel 211-2B receives light from the view point B. In other words, the pixel 211-2A and the pixel 211-2B receive light from different sources.

The image data, which the light-receiving regions 231-2A and 232-2A of the pixel 211-2A generate as they capture the light flux from the view point A, and the image data, which the light-receiving regions 231-2B and 232-2B of the pixel 211-2B generate as they capture the light flux from the view point B, are used to determine the defocus amount after addition and correlative computation. The resulting defocus amount permits focus detection by appropriate adjustment to the optical system.

As mentioned above, the phase detection by the shaded pixel method is accomplished with the help of two of the pixel 211-2 which are paired together.

As depicted in FIG. 3, which is referenced again, the central region 201 of the pixel array part 111 is responsible for phase detection by the method based on divided pixels, and the peripheral region 202 of the pixel array part 111 is responsible for phase detection by the method based on shaded pixels. Therefore, the pixel array part 111 which is constructed according to the present technology is composed of the pixels which detect the phase difference by different methods.

The detection of phase difference by different methods ensures the accuracy of detection and reduces the time required for detection. The enhanced detection accuracy and the reduced time for detection contribute to precise focusing and rapid focusing.

The following description supplements, with reference to FIGS. 10A, 10B, and 10C, what has been mentioned above about the fact that the pixels to detect phase difference by different methods, which are arranged in the central region 201 and the peripheral region 202 of the pixel array part 111, contribute to increased accuracy in phase detection and reduction of time for detection.

The pixel 211 in the central region 201 (close to the optical center) of the pixel array part 111 is depicted in FIG. 10A, which is identical with FIG. 5. What is observed in the region close to the optical center is that the light flux from the view point A and the light flux from the view point B are almost identical in the angle and amount of incident light flux. This suggests a possibility for the pixel to receive light in an optimal way if the axis passing through the center of the on-chip lens 251 is made to coincide with the boundary line between the light-receiving region 231 and the light-receiving region 232 and the light-receiving region 231 and the light-receiving region 232 are made to have the same area.

FIG. 10B depicts the pixel 211 in the peripheral region 202 (away from the optical center) of the pixel array part 111. It is to be noted that the peripheral region away from the optical center, depicted of FIG. 10B, is that where the light flux from the view point A and the light flux from the view point B are not identical in the angle and amount of incident light flux. Consequently, there is a possibility for the light-receiving region 231 and the light-receiving region 232 to become uneven in the amount of light received. In order to avoid this situation, it is necessary to arrange the on-chip lens 251, the light-receiving region 231, and the light-receiving region 232 at the positions where the axis passing through the center of the on-chip lens 251 is setoff from the boundary line between the light-receiving region 231 and the light-receiving region 232.

The foregoing remedy to adjust the position of the optical system (such as on-chip lens 251) is intended to ensure uniform light reception in the peripheral region 202 of the pixel array part 111.

In addition, any camera with an interchangeable lens needs more complicated adjustment each time of lens interchange, on which occasion the incident angle varies. The positional adjustment of the optical system (like the on-chip lens 251) is not enough, as depicted FIG. 10B; it merely copes with specific incident angles. There is a possibility for the amount of light reception to vary depending on incident angles.

The fact that variation in the amount of light received cannot be avoided only by the positional adjustment of the on-chip lens 251 will be circumvented by the shaded pixel method. According to the shaded pixel method, it is possible to adjust the light flux to be shaded simply by adjusting the length of the shading film 311. The foregoing object will be achieved if the shading film 311 has its length properly adjusted to accord with the position and incident angle.

The light-receiving region 231 and the light-receiving region 232 will receive light in an equal amount if the former is made smaller than the latter, as depicted in FIG. 10C, for example.

On the other hand, preparing the light-receiving region 231 and the light-receiving region 232 in equal size presents difficulties in making the pixels 211 in the pixel array part 111 uniform in their characteristic properties, which leads to deteriorated image quality. In other words, if the light-receiving region 231 and the light-receiving region 232, which constitute each pixel 211, are uniform in size, the pixels 211 in the pixel array part 111 keep uniform characteristic properties, which contributes to high-quality images.

In addition, it is desirable to keep the pixels 211 in the pixel array part 111 uniform in characteristic properties so as to ensure high quality for photographed images, because the pixels 211 each composed of the light-receiving region 231 and the light-receiving region 232 are used also as the pixels for ordinary photographing.

As depicted in FIG. 3, for example, because of the foregoing, the pixel array part 111 according to the present technology has the pixels 211 arranged all over it, each of which is composed of the light-receiving regions 231 and 232 which are equal in size.

Also, as mentioned above, the central region 201 of the pixel array part 111 is responsible for phase detection by the divided pixel method. The pixel in the central region 201, which is depicted in FIG. 10A, receives the light flux from the view point A and the light flux from the view point B which are almost equal in angle and amount of incident light flux. In other words, the angle of incident rays is small. Therefore, the pixel 211-1 is capable of detecting phase difference without deteriorating the image quality because it is composed of the light-receiving region 231 and the light-receiving region 232 which are equal in size, with the axis passing through the center of the on-chip lens 251 coinciding with the boundary line between the light-receiving region 231 and the light-receiving region 232.

In addition, since the pixels in the peripheral region 202 of the pixel array part 111 detect the phase difference by the shaded image method as mentioned above with reference to FIG. 8, they are able to detect the phase difference highly accurately even in the case where the incident ray has a large angle.

The foregoing may be modified by making the shading film 311 differ in length depending on the position of arrangement of the pixels. This is achieved as follows. The shading film 311 of the pixel for phase detection which is arranged close to the edge of the pixel array part 111 is made slightly longer and the shading film 311 of the pixel for phase detection which is arranged within the peripheral region 202 but close to the center of the pixel array part 111 is made slightly shorter. Thus, adjusting the length of the shading film 311 makes it possible for the pixel to perform phase detection adequately according to its position.

Let us assume that some pixels to detect phase difference by the shaded pixel method are arranged also in the central region 201 of the pixel array part 111. As mentioned above with reference to FIG. 8, the pixels to detect phase difference by the shaded pixel method are paired pixels 211 (which are used exclusively for phase detection). It follows, therefore, that arranging such pixels in the central region 201, too, decreases the pixels for ordinary photographing in the central region 201.

Moreover, although it is necessary to arrange more pixels for phase detection in order to improve the accuracy of phase detection, arranging such pixels more decreases pixels for ordinary photographing, resulting in deteriorated image quality.

However, the arrangement of pixels in the pixel array part 111, which accords with the technique of the present technology, makes it possible to decrease the pixels for phase detection by the shaded pixel method, while maintaining the pixels for ordinary photographing as many as possible. According to this embodiment, pixels are arranged in the central region 201 and the peripheral region 202 such that they perform phase detection by the method suitable for the respective regions. This permits phase detection without deteriorated image quality.

Moreover, all of the pixel 211 are constructed in the same way throughout the pixel array part 111; they can be made all together without the necessity of making separately the pixels in the central region 201 and the pixels in the peripheral region 202. This saves additional processing steps.

Moreover, because the pixels for phase detection to be arranged in the peripheral region 202 can be produced simply by adding the shading films 311A and 311B (depicted in FIG. 8), it is only necessary to convert the mask to the one which conforms to the shading films 311A and 311B. This also permits easy production without additional steps.

As mentioned above, the method for phase detection is classified into the divided pixel method and the shaded pixel method, and each method employs pixels for phase detection. Either method can achieve its object by signal processing. In other words, phase detection can be achieved by signal processing even though all of the pixel 211 are of the same structure.

Incidentally, the embodiment was explained above on the assumption that the pixel array part 111 is divided into the central region 201 and the peripheral region 202; however, it is also possible to divide the pixel array part 111 into more than two regions. For example, the pixel array part 111 may be divided into the central region 201, the peripheral region 202, and the intermediate region (not depicted) between the central region 201 and the peripheral region 202. The central region 201 has the pixels arranged therein which perform phase detection by the divided pixel method as in the embodiment mentioned above.

The intermediate region and the peripheral region 202 have the pixels arranged therein which perform phase detection by the shaded pixel method. In this case, the pixels differ in density from one region to the other. For example, the pixels for phase detection may be arranged less densely in the intermediate region than in the peripheral region 202.

Note that the foregoing embodiment may be modified such that the pixels for phase detection by the shaded pixel method gradually increase in density in going from the central region 201 to the peripheral region 202 of the pixel array part 111 (regardless of the central region 201 and the peripheral region 202). In other words, the pixels for phase detection by the divided pixel method decrease in number in going from the center to the periphery of the pixel array part 111.

Moreover, the foregoing embodiment depicted in FIG. 3 demonstrates the pixel array part 111 in which the pixel 211 has its light-receiving area divided in the lateral direction. It is to be noted from FIG. 3 that the long side of the light-receiving region 231 (and the light-receiving region 232) of the pixel 211 extends in the direction of the short side of the pixel array part 111.

The arrangement (or division) of the light-receiving area mentioned above is a mere example of the embodiment. For example, the present technology may be applied where the one pixel is divided into four light-receiving regions. That is, it may be modified such that one pixel is divided into a plurality of light-receiving regions.

Figure 11:
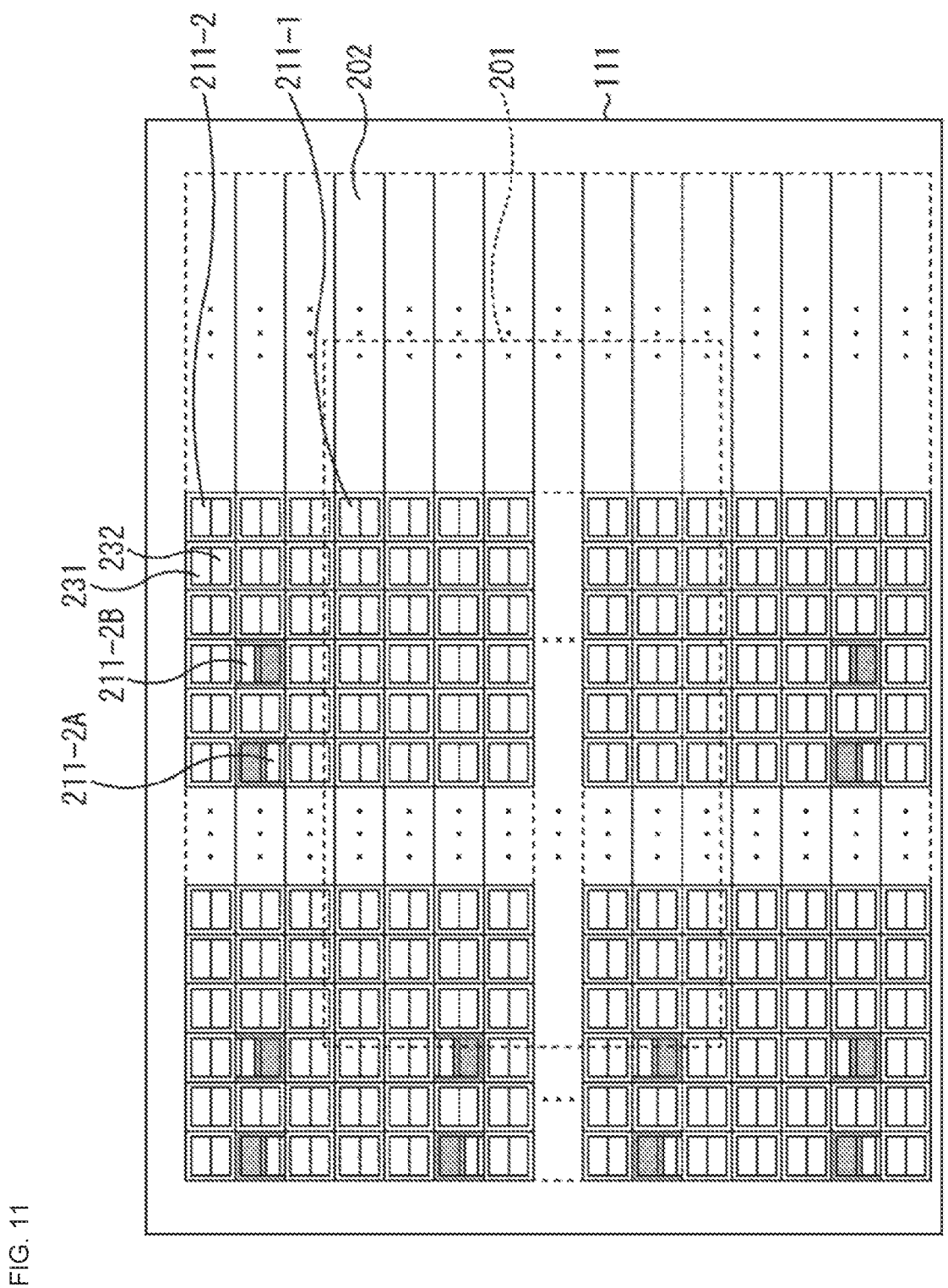
FIG. 11 is a diagram depicting another example of the divided pixel.

Moreover, each pixel may be divided into two light-receiving regions arranged in the vertical direction, as depicted in FIG. 11. It is to be noted from FIG. 11 that the long side of the light-receiving region 231 (and the light-receiving region 232) of the pixel 211 extends in the direction of the long side of the pixel array part 111. This arrangement is also within the scope of the embodiment.

In the case where the light-receiving region is divided in the vertical direction, the upper part captures the light flux entering from above and the lower part captures the light flux entering from below, thereby giving rise to their respective image data. The thus obtained image data undergo correlative computation to detect the defocus amount. In addition, as depicted in FIG. 11, the pixels 211-2A and 211-2B, which are pixels for phase detection by the shaded pixel method, have the shading film in their upper side or lower side.

In the case where the light-receiving region is divided in the vertical direction as depicted in FIG. 11, the phase difference in the vertical direction is detected. The pixel which has its light-receiving region divided in the vertical direction is also within the scope of the embodiment.

<Arrangement of Color Filters>

The following is a description of the arrangement of color filters. Each of the color filters is placed between the on-chip lens 251 and the light-receiving regions 231 and 232. The color filters are arranged according to Bayer layout for RGB (Red, Green, Blue), for example.

Figure 12:
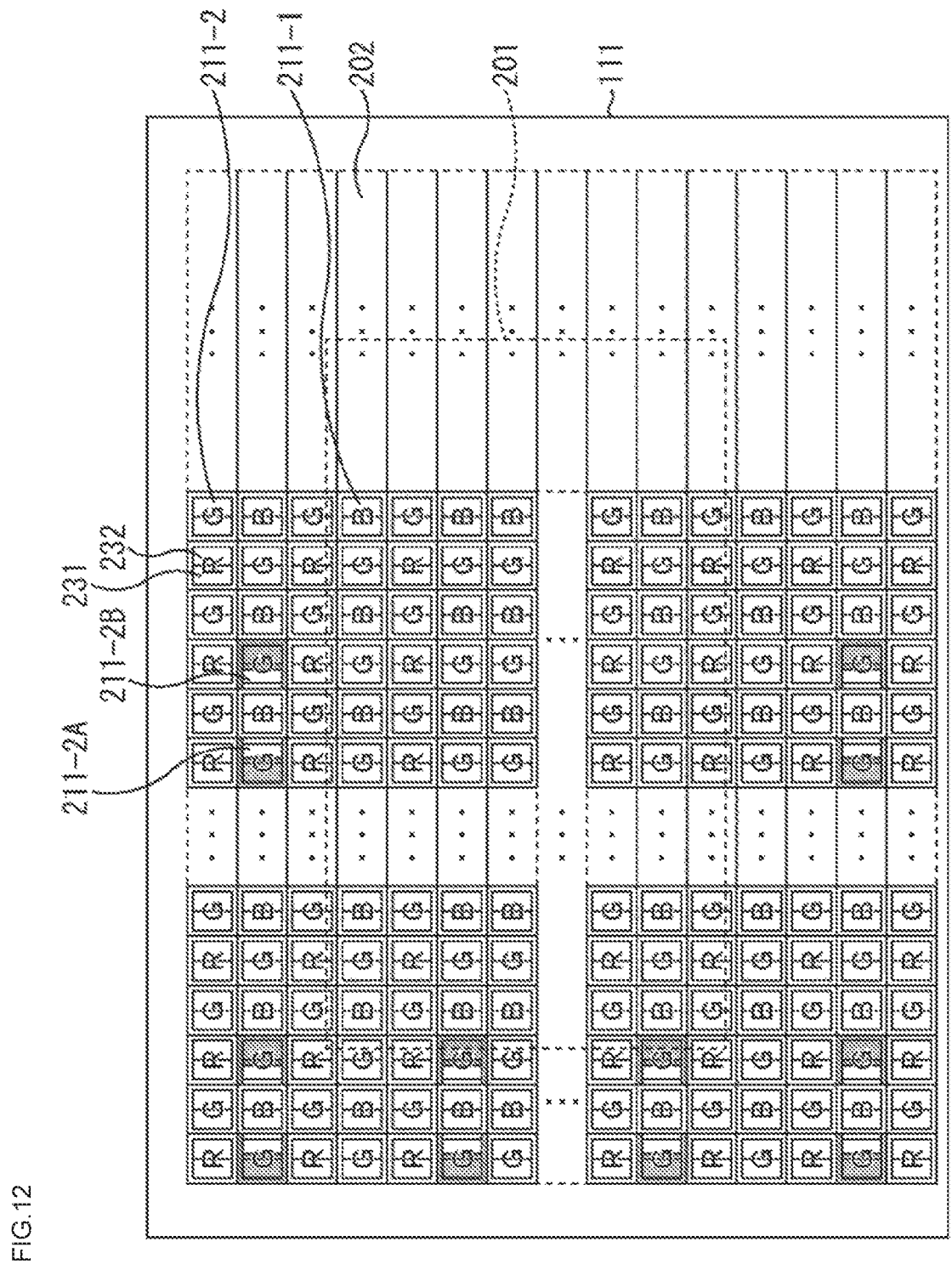
FIG. 12 is a diagram to explain the color arrangement for color filters.

The color filters are arranged as depicted in FIG. 12, for example. The color arrangement accords with Bayer layout for RGB. FIG. 12 was obtained from FIG. 3, with the color filters overlapping the pixel array part 111. In FIG. 12, R, G, and B represent red color, green color, and blue color, respectively.

FIG. 12 depicts an example in which 2×2 pixels constitute one unit. The upper left corner represents the R pixel, the upper right and lower left corners represent the G pixels, and the lower right corner represents the B pixel.

In the case where phase detection is performed by the divided pixel method, it is desirable to use only the output from the green (G) filter differing in luminosity or to use the weighted output, so as to minimize the effect of focus error due to chromatic aberration. In this case, it is desirable to embed the pixel for phase detection by the shaded pixel method in the position for the green (G) filter so that the output level is equal for the divided pixel method and the shaded pixel method.

In the case depicted in FIG. 12, the G (green) color filter is placed on the pixel for phase detection by the shaded pixel method that employs the pixels arranged in the peripheral region 202. In other words, the pixel employed for phase detection is the one which is placed at the position where the G pixel is arranged, if the four pixels of 2×2 pixels constitute one unit.

Figure 13:
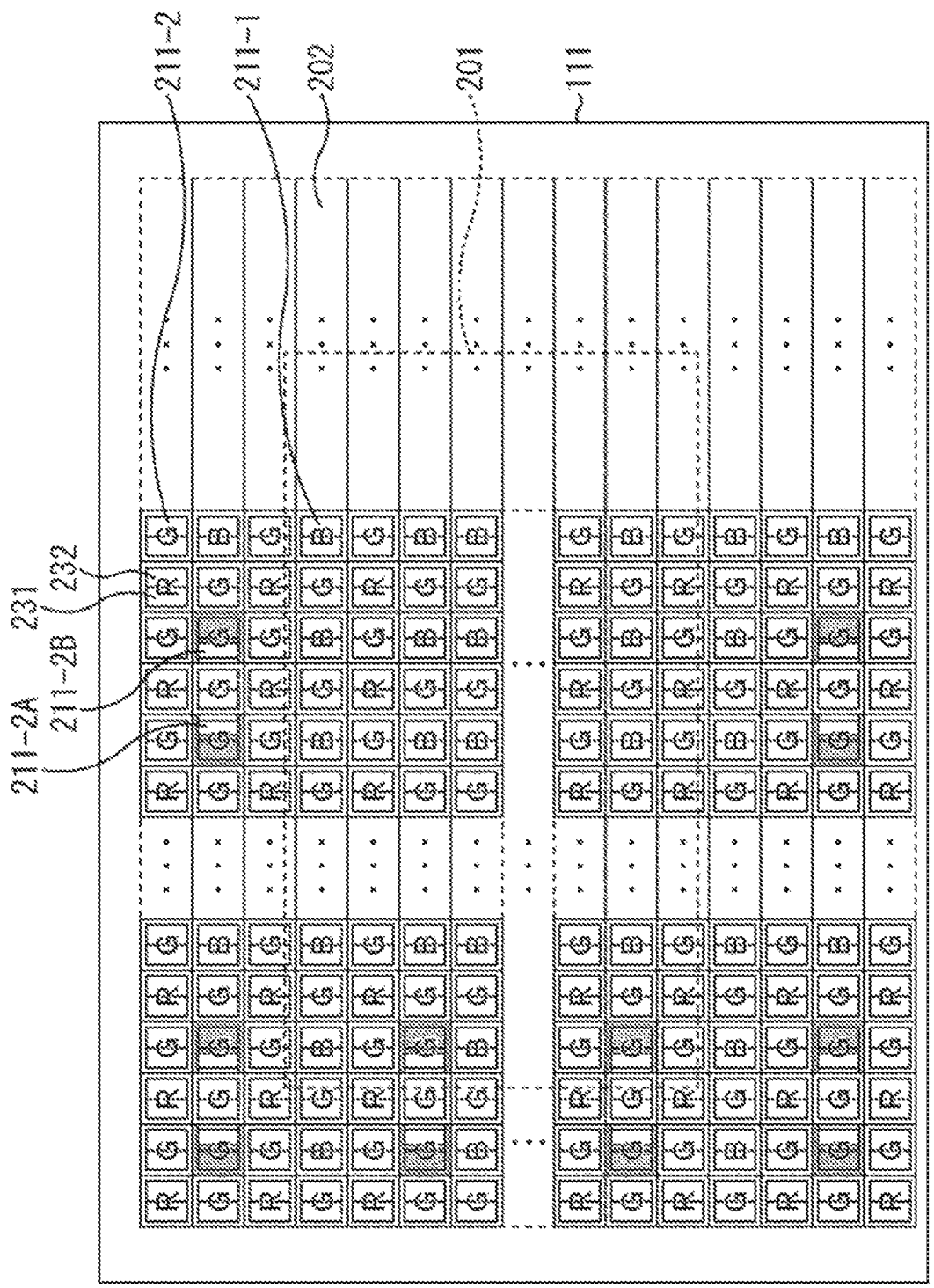
FIG. 13 is a diagram to explain another example of the color arrangement for color filters.

FIG. 13 depicts the arrangement of other colors, which accords with Bayer layout for RGB depicted in FIG. 12. The difference between them is that the G pixel as the pixel for phase detection is placed at the position where the B pixel should properly be placed.

The color arrangement depicted in FIG. 13 is characterized in that the pixel for phase detection by the shaded pixel method is embedded in the positions excluding the position for green (G) (blue (B) in FIG. 13) and the green color filter is place on it. This provision ensures higher quality than ordinary images because the original green (G) pixel is not shaded.

This color arrangement is a mere example which does not restrict the scope of the embodiment. Other possible examples include RGBW and RGBC, where W and C stand for white and clear, respectively, which are added to the three-color arrangement. Another color arrangement will be RCCC.

<Pixel Arrangement in the Second Embodiment>

The following is a description of the pixel arrangement in the second embodiment. One example of the pixel arrangement is depicted in FIG. 14.

Figure 14:
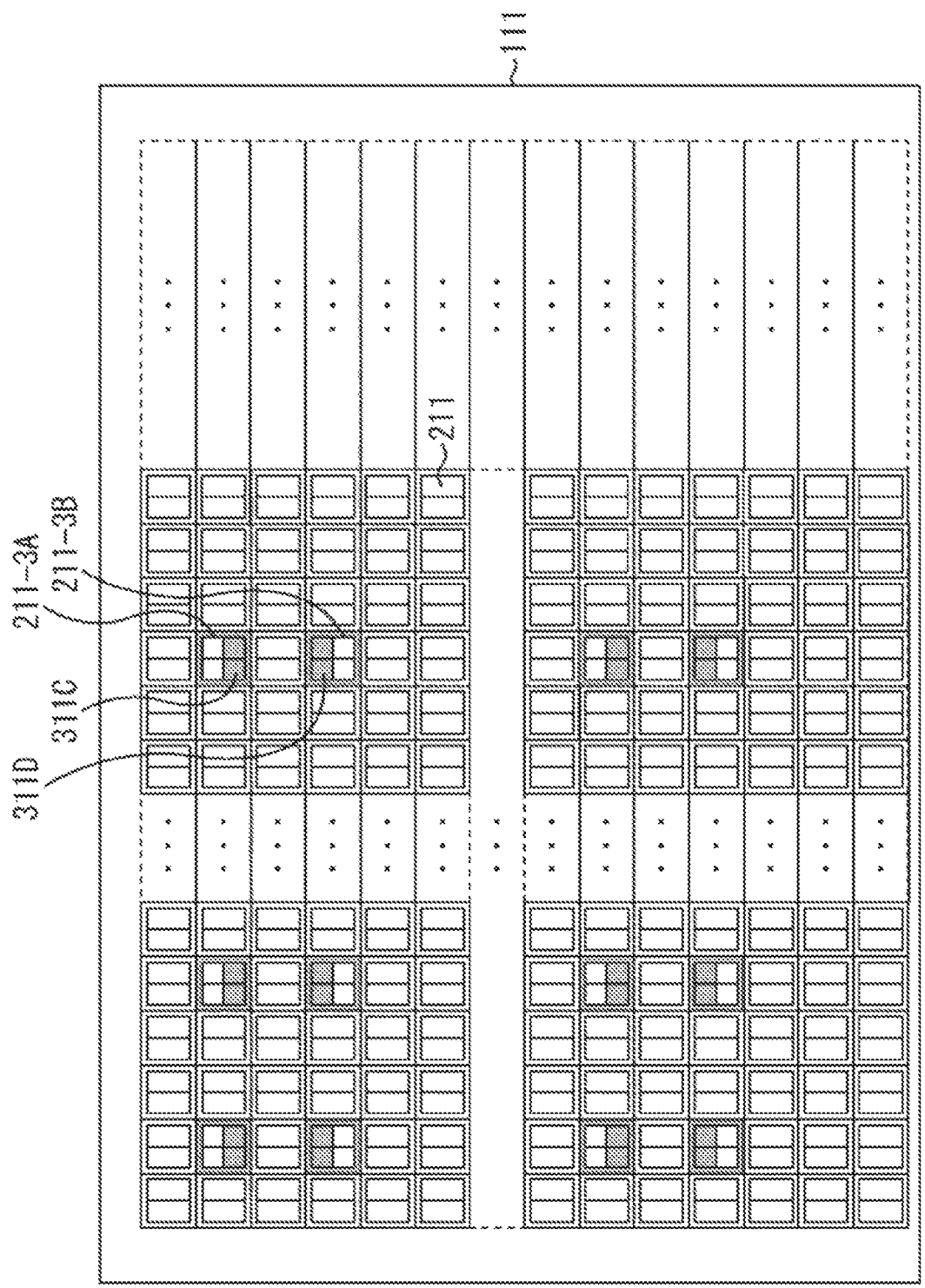
FIG. 14 is a diagram to explain the arrangement of pixels in a second embodiment.

The second embodiment illustrated in FIG. 14 is identical with the first embodiment illustrated in FIG. 3 in that all of the pixels 211 in the pixel array part 111 are divided pixels, each having two light-receiving regions. Identical parts are given identical symbols without explanation throughout the first and second embodiments depicted in FIGS. 3 and 14, respectively.

The pixels in the pixel array part 111 have each light-receiving region thereof divided in the lateral or vertical direction. This is intended to avoid the complexity that would occur during production if the pixel array part 111 includes pixels whose light-receiving regions are divided in the vertical and lateral directions.

Therefore, it is assumed here that the pixels in the pixel array part 111 have their light-receiving regions divided in the lateral direction (as depicted in FIG. 3) or in the vertical direction (as depicted in FIG. 11) in the same way as explained in the first embodiment. Note that the following explanation is based on the assumption that the pixels in the pixel array part 111 have their light-receiving regions divided in the lateral direction.

In the case where the pixels in the pixel array part 111 have their light-receiving regions divided into two sections adjoining side by side, phase detection is accomplished by using the image data of light entering from the left side and the image data of light entering from the right side. In other words, phase detection in the horizontal direction is accomplished with the help of image data in the horizontal direction or in the right-to/from-left direction.

If it is desirable to perform phase detection in the vertical direction with the help of image data in the vertical direction, it is necessary to use the pixel 211 as depicted in FIG. 11, which has its light-receiving region divided in the vertical direction, in place of the pixel which has its light-receiving region divided in the horizontal direction.

Therefore, in the case where phase detection is required in both the horizontal direction and the vertical direction, it is necessary to have both the pixel in which the light-receiving region is divided in the lateral direction as depicted in FIG. 3 and the pixel in which the light-receiving region is divided in the vertical direction as depicted in FIG. 11.

Unfortunately, it would be cumbersome and inefficient to produce the pixels mixed together, some of which have their light-receiving region divided in the lateral direction and some of which have their light-receiving region divided in the vertical direction, or to produce pixels whose light-receiving region is divided in the lateral direction and pixels whose light-receiving region is divided in the vertical direction.

Thus, the foregoing difficulty is circumvented by arranging the pixels for phase detection as depicted in FIG. 14. It is to be noted from FIG. 14 that the pixels 211 in the pixel array part 111 have all of their light-receiving region divided in the lateral direction.

According to this scheme, some specific pixels in the pixel array part 111 are designated as the pixel for phase detection which performs phase detection by the shaded pixel method. For example, the pixels 211-3A and 211-3B depicted in FIG. 14 are designated as one set of pixels for phase detection.

The pixel 211-3A has its lower part shaded with a shading film 311C. Being shaded in this manner, the pixel 211-3A receives incident light coming from above and shades incident light coming from below. Thus, the pixel 211-3A yields the image data resulting from the incident light coming from above.

Also, the pixel 211-3B has its upper part shaded with a shading film 311D. Being shaded in this manner, the pixel 211-3B receives incident light coming from below and shades incident light coming from above. Thus, the pixel 211-3B yields the image data resulting from the incident light coming from below.

Thus, the phase detection in the vertical direction is performed by means of the image data which the pixel 211-3A produces from the incident light coming from above and the image data which the pixel 211-3B produces from the incident light coming from below.

As mentioned above, the pixels for phase detection perform phase detection in the vertical direction by the shaded pixel method. On the other hand, other pixels than the pixels for phase detection which perform phase detection in the vertical direction by the shaded pixel method function as pixels for phase detection by the divided pixel method. The pixel for phase detection by the divided pixel method is one which has its light-receiving region divided in the lateral direction; it is capable of detecting the phase difference in the right-to-left (horizontal) direction, as explained in the first embodiment.

In other words, the pixel arrangement depicted in FIG. 14 permits phase detection in the vertical direction by the shaded pixel method and also permits phase detection in the horizontal direction by the divided pixel method.

This embodiment differs from the first embodiment in that it permits the pixels for phase detection in the horizontal direction by the shaded pixel method to be arranged not only in the peripheral region 202 (depicted in FIG. 3) but also in the central region 201. Arranging the pixels also in the central region 201 permits phase detection in both the horizontal direction and the vertical direction even in the central region 201.

Note that, although the foregoing description is based on the assumption that the pixel has its light-receiving region divided in the lateral direction, the second embodiment is also applicable to the pixel which has its light-receiving region divided into the vertical direction as depicted in FIG. 11. In this case, phase detection in the horizontal direction is performed by the shaded pixel method and phase detection in the vertical direction is performed by the divided pixel method.

In the meantime, the second embodiment employs the pixels for phase detection provided with the color filters which are arranged in the same way as that explained above with reference to FIGS. 12 and 13.

<Pixel Arrangement in the Third Embodiment>

The following is a description of the pixel arrangement in the third embodiment. One example of the pixel arrangement is depicted in FIG. 15.

Figure 15:
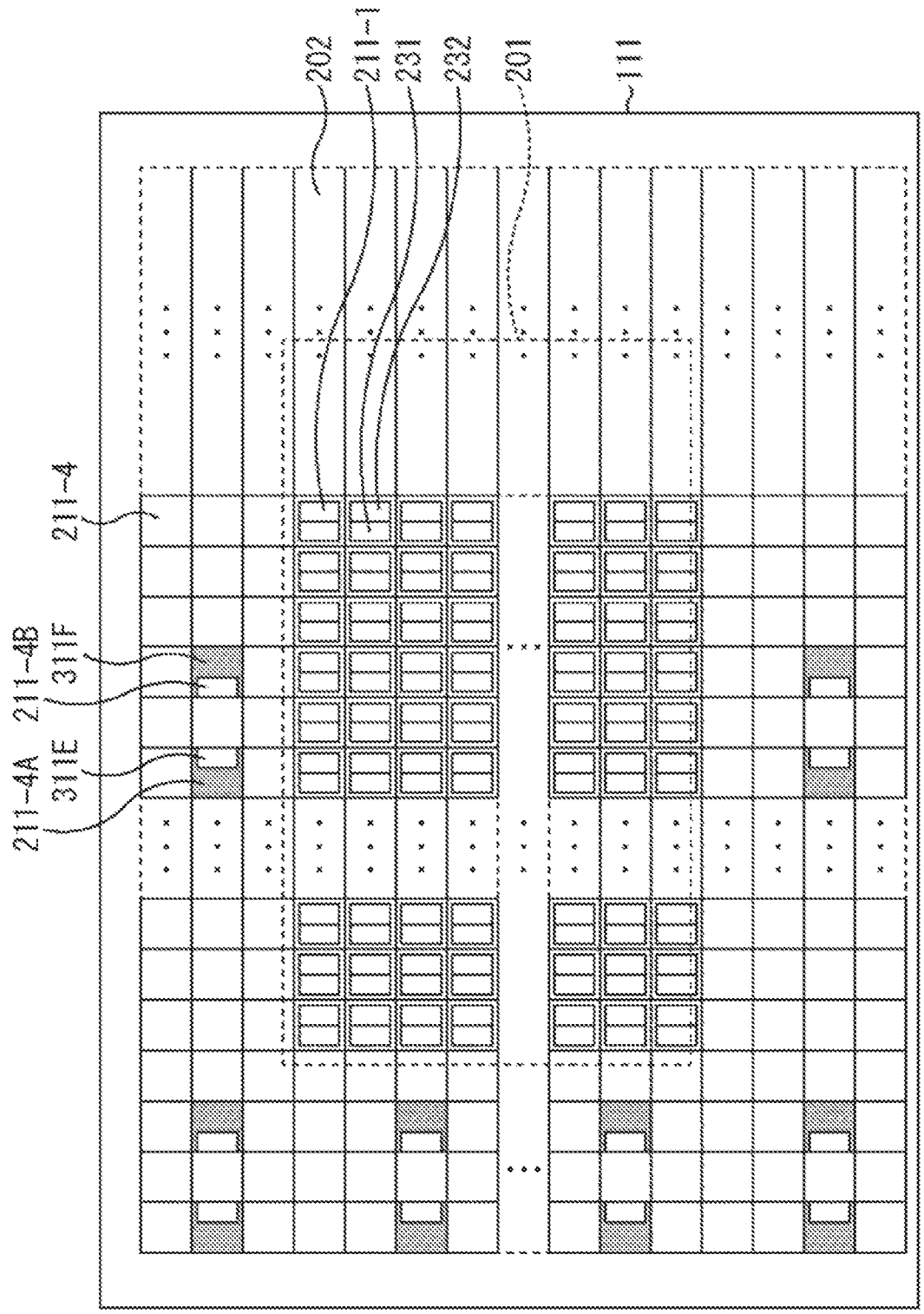
FIG. 15 is a diagram to explain the arrangement of pixels in a third embodiment.

The third embodiment depicted in FIG. 15 is identical with the first embodiment depicted in FIG. 3 in that the pixels for phase detection by the divided pixel method are arranged in the central region 201 and the pixels for phase detection by the shaded pixel method are arranged in the peripheral region 202. Moreover, the third embodiment depicted in FIG. 15 is also identical with the first embodiment depicted in FIG. 3 in that the pixels arranged in the central region 201 function as the pixels for ordinary photographing.

The third embodiment depicted in FIG. 15 is different from the first embodiment depicted in FIG. 3 in that the peripheral region 202 is not provided with the pixels with divided light-receiving regions but is provided with the pixels without divided light-receiving regions.

It is to be noted from FIG. 15 that the pixel array 111 is composed of the central region 201 and the peripheral region 202, with the former being an area in which are arranged the pixels with their light-receiving region divided (into two parts in FIG. 15) and the latter being an area in which are arranged the pixels with their light-receiving area not divided (occasionally referred to as undivided pixels hereinafter).

The undivided pixel 211-4 arranged in the peripheral region 202 is approximately equal in size to the sum of the light-receiving regions 231 and 232 of the pixel 211-1. The undivided pixel 211-4 which functions as the pixel for phase detection is partly shaded with a shading film, so that it efficiently receives the incident light coming in a certain direction.

For example, the undivided pixel 211-4A and the undivided pixel 211-4B constitute a pair of pixels for phase detection by the shaded pixel method.

The pixel 211-4A has its left part shaded with a shading film 311E, as depicted in FIG. 15, so that it receives the incident light coming from the right side and shades the incident light coming from the left side. In this way, the pixel 211-4A yields the image data resulting from the incident light from the right side.

Likewise, the pixel 211-4B has its right part shaded with a shading film 311F, as depicted in FIG. 15, so that it receives the incident light coming from the left side and shades the incident light coming from the right side. In this way, the pixel 211-4B yields the image data resulting from the incident light from the left side.

Thus, the phase detection in the right-to-left direction (or horizontal direction) is accomplished with the help of the image data which the pixel 211-4A yields from the incident light from the right side and the image data which the pixel 211-4B yields from the incident light from the left side.

The pixels constructed as mentioned above receive the light under the same conditions as depicted in FIGS. 8 and 9. Therefore, they realize phase detection by the shaded pixel method in the same way as explained with reference to FIGS. 8 and 9.

Note that the phase detecting pixels arranged in the peripheral region 202 as depicted in FIG. 15 are intended for phase detection in the horizontal direction. However, their arrangement may be changed such that they perform phase detection in the vertical direction as depicted in FIG. 14 (in which the shading film is placed at the upper side or lower side).

Alternatively, it is possible to provide the peripheral region 202 with both the pixels for phase detection in the horizontal direction by the shaded pixel method and the pixels for phase detection in the vertical direction by the shaded pixel method.

Alternatively, it is possible to combine the second embodiment and the third embodiment together. In this case, the peripheral region 202 is provided with the undivided pixels 211-4 and the pixels for phase detection in the horizontal direction by the shaded pixel method and the central region 201 is provided with the divided pixels and the pixels for phase detection in the vertical direction by the shaded pixel method.

Alternatively, it is also possible to combine the second embodiment and the third embodiment together. In this case, the peripheral region 202 is provided with the undivided pixels 211-4 and the pixels for phase detection in the vertical direction by the shaded pixel method and the central region 201 is provided with the divided pixels and the pixels for phase detection in the horizontal direction by the shaded pixel method.

The third embodiment is same as the first embodiment in that the central region 201 of the pixel array part 111 is responsible for phase detection by the divided pixel method. In the central region 201, where the angle of the incident ray is small, the light-receiving regions 231 and 232 have the same size, so that the axis passing through the center of the on-chip lens 251 coincides with the boundary line between the light-receiving regions 231 and 232. Thus the pixels 211 is able to perform phase detection without deteriorating image quality.

The third embodiment is also same as the first embodiment in that the peripheral region 202 of the pixel array part 111 is responsible for phase detection by the shaded pixel method. The peripheral region 202 functions in the same way as explained with reference to FIG. 10B. That is, the light flux from the view point A and the light flux from the view point B are not equal in angle (or the amount of incident light flux), and the incident ray has an acute angle.

The third embodiment permits accurate phase detection even in the situation where the incident ray angle is acute.

It also permits more accurate phase detection if an adequate adjustment is made to the length of the shading films 311E and 311F.

In the case where any one of the embodiments mentioned above is applied to an interchangeable lens camera, a provision may be made so that the pixel for phase detection varies in the length of the shading film 311 according to the lens mounted (exchanged). This is accomplished by arranging on line A the pixels for phase detection which has the shading film 311 corresponding to the lens A and also arranging on line B the pixels for phase detection which have the shading film 311 corresponding to the lens B.

In this case, the camera performs phase detection by means of the pixel for phase detection which is arranged in line A if the camera decides that the lens A is attached thereto, and the camera performs phase detection by means of the pixel for phase detection which is arranged in line B if the camera decides that the lens B is attached thereto. Thus, it is possible to select by option the structure for accurate phase detection according to the lens.

Another advantage of the third embodiment is that it is possible to reduce the pixels for phase detection by the shaded pixel method without reducing the pixels for ordinary photographing. The fact that the central region 201 and the peripheral region 202 are provided with the pixels for phase detection by the method suitable for each region as mentioned above leads to phase detection free of deteriorated image quality.

Incidentally, the third embodiment mentioned above is based on the assumption that the pixel array part 111 is divided into two regions (the central region 201 and the peripheral region 202); however, this constitution may be modified such that the pixel array part 111 is divided into three or more regions. For example, the three regions may include the central region 201, the peripheral region 202, and the intermediate region (not depicted) between the central region 201 and the peripheral region 202. Also, the central region 201 is provided with the pixels for phase detection by the divided pixel method as in the embodiment mentioned above.

The intermediate region and the peripheral region 202 have the pixels arranged therein which perform phase detection by the shaded pixel method. In this case, the pixels differ in density from one region to the other. For example, the pixels for phase detection may be arranged less densely in the intermediate region than in the peripheral region 202.

This arrangement may be modified such that the pixels for phase detection by the shaded pixel method gradually increases in number in going from the center to the periphery.

Although the third embodiment mentioned above with reference to FIG. 15 is based on the assumption that the divided pixel of the pixel 211 has its light-receiving region divided in the lateral direction. However, the same technique may be applied to the pixel which has its light-receiving region divided in the lateral direction as explained with reference to FIG. 11.

In the meantime, the third embodiment employs the pixels for phase detection provided with the color filters which are arranged in the same way as that explained above with reference to FIGS. 12 and 13.

<Focus Adjustment>

As mentioned above, the pixel array part 111 according to the present embodiment is composed of pixels for phase detection by different methods. Phase detection may be performed by different methods at all times, or by either of the methods selected according to the condition, or by both of the different methods.

For example, any one method for phase detection will be selected according to the type of the lens attached to the camera. That is, phase detection may be performed by the divided pixel method, the shaded pixel method, or the divided pixel method and the shaded pixel method combined together. In other words, the method for phase detection may be selected and the pixel for phase detection suitable for the selected method may be selected.

In the case of phase detection (focus adjustment) in the region where there exist both the pixel for phase detection by the divided pixel method and the pixel for phase detection by the shaded pixel method, focus adjustment can be made only with the information obtained by the shaded pixel method. In this case, the region for focus adjustment establishes the method for phase detection and the thus established method performs phase detection by using the pixel for phase detection.

Figure 16:
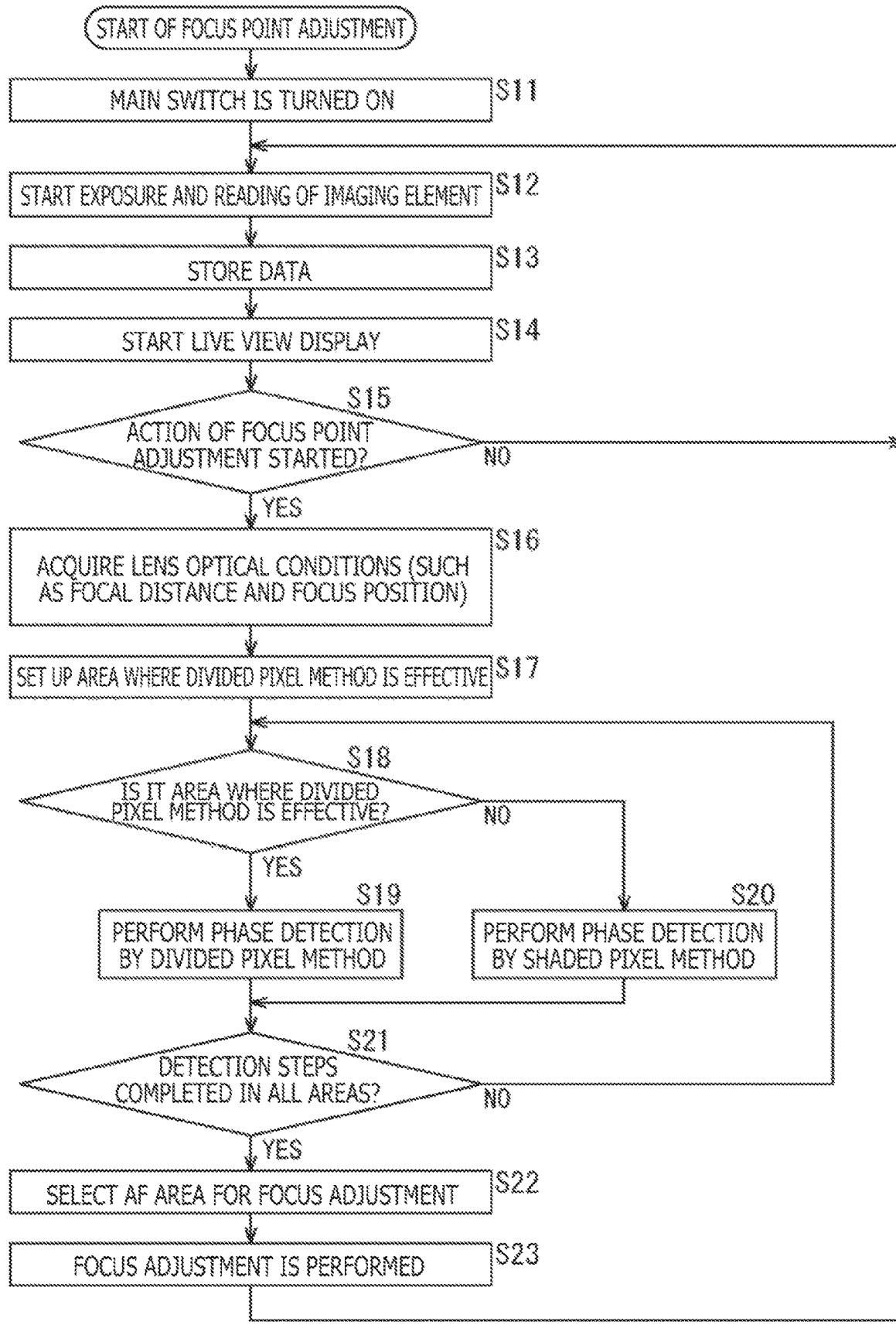
FIG. 16 is a flow chart to explain the focus adjustment.

The procedure for focus adjustment will be described with reference to the flowchart depicted in FIG. 16.

The procedure starts with Step S11 in which the operating unit 27 of the imaging apparatus 10 (FIG. 1) is operated to turn on the main switch. In Step S12, the imaging element 22 is exposed and the image data is read out for image display on the display unit 25 (for live view display). In Step S13, the exposure value and the image data (which has been read out) are stored. In Step S14, the live view display starts.

Incidentally, although the output for live view display and the output from the pixel for phase detection may be output altogether, it is possible to constitute the circuit in such a way that the output for live view display and the output from the pixel for phase detection are output separately for rapid focus detection. Such circuit construction performs reading separately for the output for live view display and the output for the pixel for phase detection.

In Step S15, the user half-depresses the shutter button in the operating unit 27 (this step decides whether or not an instruction to start action for focus adjustment has been given). If the decision in Step S15 is no (that is, any instruction for action for focus adjustment has not been issued), the step returns to Step S12 to repeat the subsequent steps.

On the other hand, if the decision in Step S15 is yes (that is, an instruction for action for focus adjustment has been issued), the step proceeds to Step S16. Step 16 and subsequent steps perform focus adjustment. In Step S16, the system acquires the optical conditions of the lens, such as focus length and focus position.

In Step S17, the system determines the effective area (the region from the center of the image plane) for phase detection (or focus detection) by the divided pixel method. For example, it is possible to establish a slightly larger area for the region where phase detection is performed by the divided pixel method in the peripheral region 202 if the incident light has an obtuse angle there.

Note that it is possible to set the system in such a way that phase detection is performed by using only the region which has previously been set for the individual phase detection method regardless of the optical conditions of lens in the case of simplified processing or in the case where the region for the divided pixel method and the region for the shaded pixel method are separated from each other as in the third embodiment mentioned above with reference to FIG. 15.

In Step S18, a decision is made as to whether or not the area for processing is within the effective area for the divided pixel method, based on the effective area for the divided pixel method which has been established in Step S17. Phase detection is performed for each divided area, with the pixel array part 111 being divided into a plurality of areas (or dividing the photographed image into a plurality of areas).

The flow proceeds to Step S19 if a decision is made in Step S18 that the area to be processed is within the effective area for the divided pixel method. In Step 19, phase detection is performed by using the output data from the pixel for phase detection by the divided pixel method.

On the other hand, if a decision is made that the area for processing is not within the effective area for the divided pixel method, the flow proceeds to Step S20. In Step S20, phase detection is performed by using the output data from the pixel for phase detection by the shaded pixel method.

In Step S21, a decision is made as to whether or not phase detection has been performed in all the areas, and the flow returns to Step S18 repeatedly until a decision is made that the phase detection has been performed for all over the areas. The areas for processing are sequentially switched, so that they repeatedly undergo the same processing that follows Step S18.

On the other hand, the flow proceeds to Step S22 if a decision in Step S21 is made that phase detection has completed in all the areas.

As mentioned above, the procedure for phase detection is performed in a plurality of areas divided among the imaging elements 22 (image sensors). The procedure for phase detection employs the output from the pixels for phase detection which have been set by the step for region setting (mentioned above) and performs computations all over the areas. Each of the methods performs basic computations for phase detection in the same way but the filtering process and parameters in computation may vary because there are differences in the arrangement and density of the pixels and the number of pixels in one area.

In Step S22, the amount of phase difference (or the defocus amount) is selected from all the areas for which computation has completed in order to drive the lens to the focused position. In Step S23, focus adjustment is made to eliminate the selected defocus amount.

Step S22 to select the amount for phase detection from all the areas is achieved by selecting the closest area among a plurality of areas. An alternative provision may be made in which computation is performed only on some of the areas in which the user has established a specific area for focus detection.

The foregoing steps are repeated until the focus point is eventually determined.

Incidentally, the foregoing procedure is based on an assumption that after a decision is made in Step S15 that an instruction to start the action to start focus adjustment, the action for focus adjustment is carried out in Step S16 and subsequent steps. This may be modified such that the action for focus adjustment is performed in the absence of any instruction to start the action for focus adjustment.

There is alternative procedure in which the action for focus detection in Steps S16 to S22 is performed regardless of the instruction for focus adjustment, but only the action for focus adjustment (lens driving) is not performed, and as soon as the shutter button is depressed, the focus adjustment starts so as to realize the rapid autofocusing.

<Constitution of the Endoscope System>

The technology disclosed herein may be applied to various products in addition to the imaging apparatus 10 mentioned above. For example, the technology disclosed herein may be applied to systems for endoscopic operation. They include, for example, systems for endoscopic operation, surgical operation, and microscopic operation. The following is concerned mostly with the first one.

For example, the endoscope has the imaging unit 1027 (depicted in FIG. 18) which is provided with the CMOS image sensor 100 having the pixel array part 111 as depicted in FIG. 3. The CMOS image sensor 100, which is based on the technique disclosed herein, is capable of accurate phase detection and accurate focusing without image quality deterioration. Therefore, the endoscope based on the technique disclosed herein is able to perform accurate phase detection and focusing without deteriorating the quality of the image of the part under operation.

Figure 17:
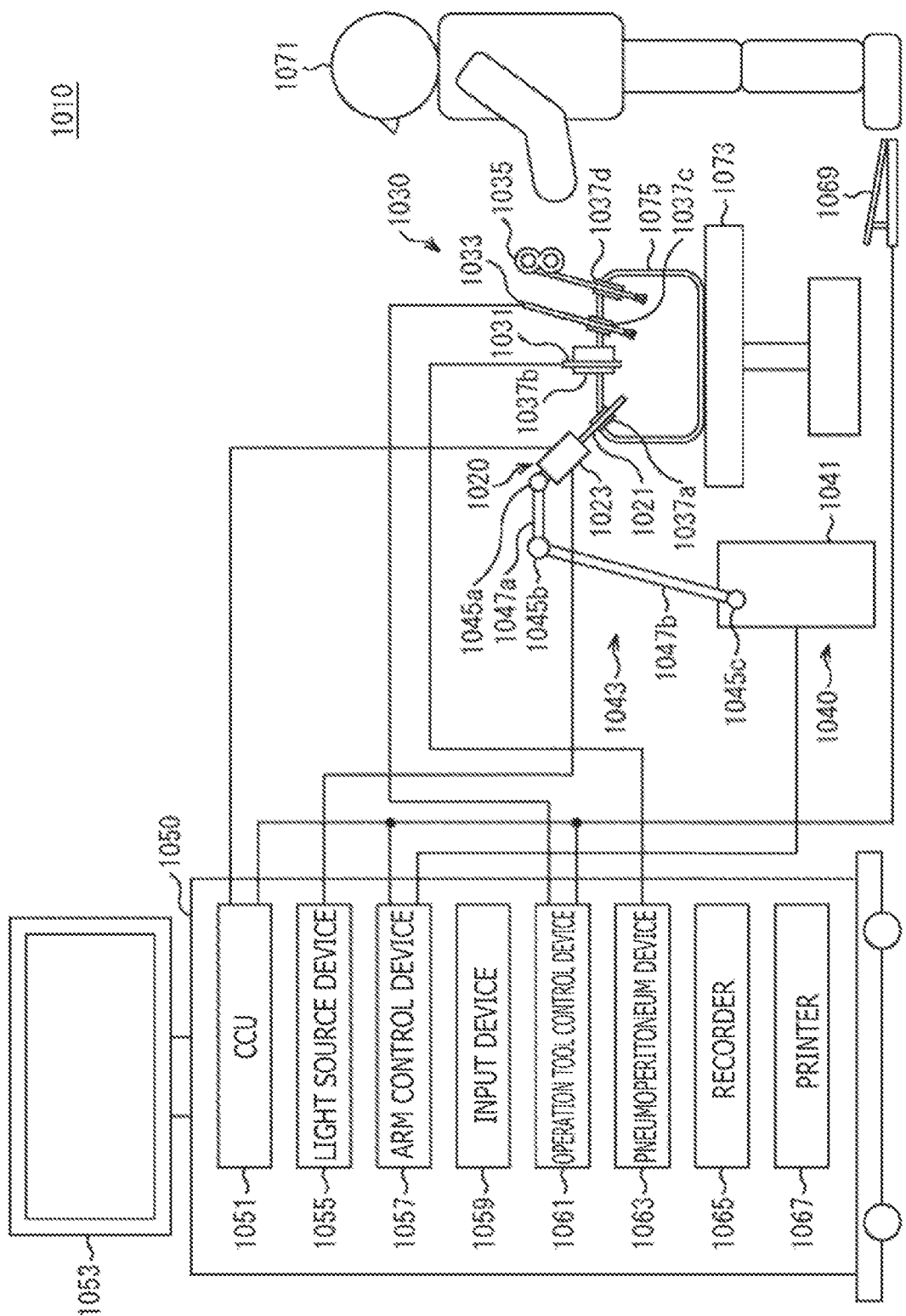
FIG. 17 is a diagram depicting the configuration of an endoscopic operation system.

FIG. 17 is a schematic diagram depicting an example of the constitution of an endoscopic operation system 1010 to which is applied the technique disclosed herein. FIG. 17 depicts how an operator (doctor) 1071 perform operation on a patient 1075 lying on a patient bed 1073 by using the endoscopic operation system 1010. It is depicted that the endoscopic operation system 1010 includes an endoscope 1020, various tools 1030, a supporting arm device 1040 to support the endoscope 1020, and a cart 1050 carrying various tools for endoscopic operation.

The endoscopic operation employs trocars 1037a to 1037d, which are cylindrical tools to be punctured into the abdominal wall, instead of abdominal section. The trocars permit a lens barrel 1021 of the endoscope 1020 and other tools 1030 to be inserted into the body cavity of the patient 1075. In the illustrated example, the tools 1030 include a pneumoperitoneum tube 1031, an energy treating tool 1033, and forceps 1035, which are inserted into the body cavity of the patient 1075. The energy treating tool 1033 is intended to cut and peel the tissue or seal the blood vessel by means of high-frequency current and ultrasonic vibration. The illustrated tool 1030 is merely one example, and it may include forceps and retractors and others which are commonly used for endoscopic operation.

The endoscope 1020 photographs the part under operation in the body cavity of the patient 1075, and the thus photographed image is displayed on a display device 1053. The operator 1071 watches in real time the image of the part under operation which is displayed on the display device 1053 while the operator is performing operation, such as cutting of the affected part by means of the forceps 1035 and the energy treating tool 1033. Incidentally, the pneumoperitoneum tube 1031, the energy treating tool 1033, and the forceps 1035 are held by the operator 1071 or assistant during operation.

(Supporting Arm Device)

The supporting arm device 1040 has an arm 1043 extending from a base 1041. The illustrated arm 1043 includes joints 1045a, 1045b, and 1045c, and links 1047a and 1047b. It is driven under control from an arm control device 1057. The arm 1043 supports the endoscope 1020 and controls its position and direction. This ensures the endoscope 1020 its stable positioning and fixing.

(Endoscope)

The endoscope 1020 includes the lens barrel 1021 to be inserted into the body cavity of the patient 1075 as deep as necessary and a camera head 1023 to which the base of the lens barrel 1021 is fitted. The illustrated endoscope 1020 has the solid lens barrel 1021, which may be replaced by a flexible one.

The lens barrel 1021 has an open end into which an object lens is fitted. The endoscope 1020 is connected to a light source device 1055, which generates light to be introduced to the forward end of the lens barrel through the light guide extending inside the lens barrel 1021, so that the affected part is illuminated toward the body cavity of the patient 1075 through an object lens. Incidentally, the endoscope 1020 may be that of direct view type, aslant view type, or side view type.

The camera head 1023 has the optical system and the imaging element installed inside. The optical system captures light reflected from the object for observation and concentrates it on the imaging element. The imaging element performs photoelectric conversion on the received light, thereby giving rise to the image signal corresponding to the observed image or electrical signals corresponding to the light of observation. The image signal (in the form of RAW data) is transferred to a CCU (Camera Control Unit) 1051. Incidentally, the camera head 1023 is provided with the function to adjust the magnification ratio and the focal distance by appropriate movement of the optical system.

Incidentally, the camera head 1023 may be provided with more than one imaging element so that it is capable of stereophotographing (3D display). In this case, the lens barrel 1021 is provided with relay optical systems to introduce observing light to a plurality of imaging elements.

(Apparatuses Mounted on the Cart)

The CCU 1051 includes CPU (Central Processing Unit) and GPU (Graphics Processing Unit), so that it controls the actions of the endoscope 1020 and the display device 1053. To be concrete, the CCU 1051 receives image signals from the camera head 1023 and performs image processing on them, such as demosaicing to convert the image signals into visible images. The CCU 1051 also presents the processed image signals to the display device 1053. Moreover, the CCU 1051 transmits control signals to the camera head 1023 so as to control its driving. The control signals include information related to magnification ratio, focus distance, and photographing condition.

The display device 1053, which is under control by the CCU 1051, displays images according to the image signals processed by the CCU 1051. In the case where the endoscope 1020 is capable of high-resolution photographing, such as 4K (3840 horizontal pixels×2160 vertical pixels) or 8K (7680 horizontal pixels×4320 vertical pixels), and/or 3D photographing, the display device 1053 is one which is capable of displaying high-resolution images and/or 3D images. The display device 1053 for high-resolution images (such as 4K and 8K) should desirably be one larger than 55 inches and up, so that the operator views it with a feeling of immersion. The display device 1053 may be a combination of more than one unit differing in resolution and size.

The light source device 1055 may be, for example, an LED (light emitting diode) or the like; it supplies the endoscope 1020 with light that illuminates the part under operation.

The arm control device 1057 is composed of, for example, processors including CPU; it works according to a prescribed program, thereby controlling the movement of the arm 1043 of the supporting arm device 1040 according to a prescribed control method.

An input device 1059 is an input interface for the endoscopic operation system 1010. The input device 1059 permits the user to enter information and instruction into the endoscopic operation system 1010. For example, the input device 1059 permits the user to enter various kinds of information related to the patient's body and the method of operation and the like. Such information may include instruction to move the arm 1043, instruction to change the photographing conditions (such as illumination, magnification ratio, and focus distance) for the endoscope 1020, and instruction to drive the energy treating tool 1033.

The input device 1059 is not specifically restricted; it may be any known one. For example, it may be any one or more of mouse, keyboard, touch panel, switch, foot switch 1069, and lever. A touch panel as the input device 1059 may be placed on the screen of the display device 1053.

Alternatively, the input device 1059 may be a wearable device of eyeglass type or an HMD (Head Mounted Display). It permits the user to enter various kinds of information by user's gesture or gaze which it can detect. In addition, the input device 1059 includes a camera capable of detecting the user's action. The camera photographs the user's action such as gesture and gaze, and the resulting image is used to enter information.

Moreover, the input device 1059 includes a microphone capable of catching the user's voice, which can be used to enter information. The input device 1059 which permits the entry of information without touching makes it possible for the user (or the operator 1071) in the clean area to operate the equipment in the unclean area without touching. At the same time the input device 1059 permits the user to operate the machine while holding the tool in user's hand. This contributes to the user's convenience.

A treating tool control device 1061 controls the driving of the energy treating tool 1033 which is used to scorch and cut the tissue or seal the blood vessel. A pneumoperitoneum device 1063 supplies gas into the body cavity of the patient 1075 through the pneumoperitoneum tube 1031 to expand the body cavity of the patient 1075 for the purpose of ensuring the visual field for the endoscope 1020 and ensuring the operator's working space. A recorder 1065 is a device to record various kinds of information related to operation. A printer 1067 is a device to print various kinds of information related to operation in the form of text, image, and graph.

The endoscopic operation system 1010 is characterized by the following constituents which are described below in more detail.

(Supporting Arm Device)

The supporting arm device 1040 includes the base 1041 and the arm 1043 extending from the base 1041. In the case of the simplified example depicted in FIG. 17, the arm 1043 includes the joints 1045a, 1045b, and 1045c, and the links 1047a and 1047b joined by the joint 1045b.

In actual, for the arm 1043 to have a desirable degree of freedom, the joints 1045a to 1045c, and the links 1047a and 1047b are properly varied in shape, number, arrangement, and rotational direction. For example, the arm 1043 is so constructed as to have more than 6 degrees of freedom. The arm designed in this manner permits the endoscope 1020 to move freely in the range which the arm 1043 covers. This makes it possible for the operator to insert in any desired angle the lens barrel 1021 of the endoscope 1020 into the body cavity of the patient 1075.

Each of the joints 1045a to 1045c is provided with an actuator, so that it is capable of turning around a prescribed axis. The actuator is controlled by the arm control device 1057, so that each of the joints 1045a to 1045c has its rotating angle controlled and the arm is controlled for its movement. Thus, the endoscope 1020 has its position and posture controlled appropriately. The arm control device 1057 drives the arm 1043 by means of known methods for power control and position control.

Operation of the endoscope system proceeds in the following manner, for example. First, the operator 1071 turns on the input device 1059 (or depresses a foot switch 1069).

This action causes the arm control device 1057 to drive the arm 1043, thereby controlling the position and posture of the endoscope 1020. Thus, the endoscope 1020 fixed to the fore-end of the arm 1043 is moved to a desired position and fixed there. Note that the arm 1043 may be manipulated by the so-called master-slave method. In this case, the arm 1043 may be remote-controlled by the user through the input device 1059 placed away from the operating room.

Moreover, the endoscope system may be manipulated by power assist control. In this case, the arm control device 1057 receives an external force from the user and this force drives the actuator attached to each of the joints 1045a to 1045c so that the arm 1043 moves smoothly. This permits the user to move the arm 1043 with a comparatively small force while holding it directly. In this case, the user can move the endoscope 1020 intuitively by a simpler operation. This leads to the user's convenience.

It has been a conventional practice of operation under an endoscope that the endoscope 1020 is held by the doctor called scopist. By contrast, the supporting arm device 1040 makes it possible to firmly support the endoscope 1020 without resorting to the man's hand. This leads to the stable image of the part under operation, which contributes to smooth operation.

Note that it is not always necessary that the arm control device 1057 is mounted on the cart 1050. Also, the arm control device 1057 is not always necessary to be a single unit; it may be divided into several units each mounted on the joints 1045a to 1045c of the arm 1043 of the supporting arm device 1040. In this case, the arm 1043 functions as the arm control devices 1057 which work in concert with one another.

(Light Source Device)

The light source device 1055 emits light to illuminate the part under operation to be photographed by the endoscope 1020. It is a white light source such as LED, laser light source, and a combination thereof. A white light source may be formed from RGB laser light sources combined together. In this case, colors (wavelengths) can be controlled individually and precisely for output power and output timing. Thus, the light source device 1055 permits the adjustment of white balance for the photographed image.

Further, photographing with a laser light source is accomplished as follows. First, the object for observation is illuminated in the time-shared way with individual laser beams from the RGB laser light source. The imaging element in the camera head 1023 is driven (controlled) in synchronism with the illuminating timing, so that it records time-shared images in response to the respective RGB laser beams. This method yields color images without the necessity of providing the imaging elements with color filters.

Further, the light source device 1055 may be driven such that the emerging light varies in intensity at a prescribed time interval. In this case, the imaging element of the camera head 1023 is driven in synchronism with the timing at which the light intensity varies, so that time-shared images are obtained. Thus obtained images are combined together to give an image having a broad dynamic range (free of excessive black and white).

Further, the light source device 1055 may be so constructed as to emit light having a specific range of wavelengths suitable for observation under special light. Observation under special light relies on a light having a narrower band width than white illuminating light for ordinary observation, because the body tissue absorbs light differently depending on the wavelength. The foregoing is typical for so-called narrow band imaging which is designed to photograph with high contrast a specific tissue such as blood vessels on the surface layer of the mucous membrane.

Alternatively, observation under special light includes observation under fluorescent light which is intended to give an image resulting from fluorescent light that emerges upon irradiation with exciting light. Observation under fluorescent light is accomplished by irradiating a body tissue with exciting light and observing the reflected light from the body tissue (autofluorescent observation). Alternatively, it is accomplished by illuminating a sample of the body tissue, which has been injected with a reagent, such as indocyanine green (ICG), with exciting light corresponding to the fluorescent wavelength of the reagent. In this case, the light source device 1055 should be one which is capable of emitting narrow-band light and/or exciting light corresponding to observation with a special light mentioned above.

(Camera Head and CCU)

Figure 18:
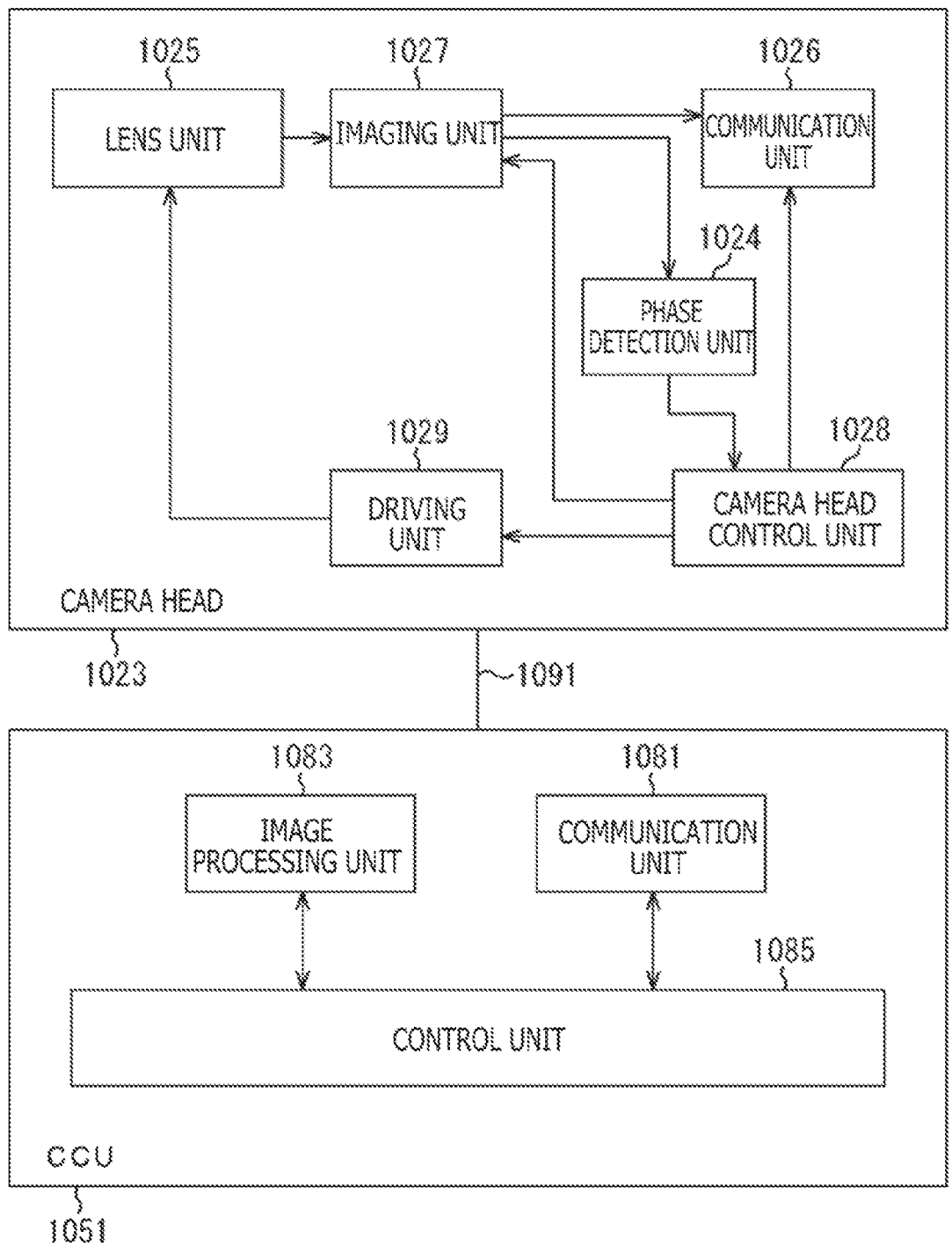
FIG. 18 is a block diagram depicting the configuration of a camera head and a CCU.

The following is a detailed description of the camera head 1023 and the CCU 1051 of the endoscope 1020 which are depicted in FIG. 18. FIG. 18 is a block diagram depicting how the camera head 1023 and the CCU 1051 depicted in FIG. 17 work.

FIG. 18 depicts that the camera head 1023 includes a phase detection unit 1024, a lens unit 1025, an imaging unit 1027, a driving unit 1029, a communication unit 1026, and a camera head control unit 1028. In addition, the CCU 1051 includes a communication unit 1081, an image processing unit 1083, and a control unit 1085 as the function thereof. The camera head 1023 and the CCU 1051 are connected together for bilateral communication through a transmission cable 1091.

The structure and function of the camera head 1023 are explained first in the following. The camera head 1023 has the lens unit 1025, which is an optical system attached to the connecting part of the lens barrel 1021. The lens barrel 1021 permits the light from the observed subject to enter through the fore-end thereof. The light which has entered through the lens barrel reaches the camera head 1023 and passes through the lens unit 1025. The lens unit 1025 consists of several lenses for focusing and zooming. The lens unit 1025 has its optical properties adjusted so that the light from the subject under observation impinges on the imaging element of the imaging unit 1027. The focusing lens and zooming lens are so arranged as to move along the optical axis for adjustment of the magnification ratio and focus point of the subject image.

The imaging unit 1027 has the imaging element as the major constituent. It is placed behind the lens unit 1025. The imaging element receives the observing light that has passed through the lens unit 1025. Then the observing light undergoes photoelectric conversion to give the image signal corresponding to the observing light. The image signal, which has been generated by the imaging unit 1027, is transmitted to the communication unit 1026.

The imaging element as the constituent of the imaging unit 1027 is an image sensor of CMOS (Complementary Metal Oxide Semiconductor) type, for example. It has the Bayer layout for color photographs. Note that it is possible to use an imaging element suitable for high resolution (exceeding 4K). The high-resolution image permits the operator 1071 to minutely grasp the state of the affected part, which contributes to smooth operation.

Further, the imaging unit 1027 may be composed of one set of two imaging elements for 3D display, one for the left eye and the other for the right eye. The 3D image permits the operator 1071 to accurately grasp the depth of the living tissue at the site under operation. Note that, in the case where the imaging unit 1027 is composed of multiple imaging elements, there are a plurality of the lens unit 1025, corresponding to the respective imaging elements.

Further, it is not always necessary that the imaging unit 1027 is attached to the camera head 1023; it may be placed inside the lens barrel 1021 and immediately behind the object lens.

The driving unit 1029 has the actuator as the major constituent. It moves the focus lens and zoom lens of the lens unit 1025 along the optical axis over a prescribed distance according to control from the camera head control unit 1028. The action in this way permits the imaging unit 1027 to adjust the magnification ratio and focus point of the image.

The camera head control unit 1028 controls focus adjustment in response to the data from the phase detection unit 1024. The imaging unit 1027 includes the CMOS image sensor 100 having the pixel array part 111 as depicted in FIG. 3. The effect of this constitution is that the imaging unit 1027 includes the phase detecting pixels and the phase detection unit 1024 receives data from the phase detecting pixels included in the imaging unit 1027.

The phase detection unit 1024 receives data from the pixel for phase detection and processes them for phase detection, and finally dispatches the result to the camera head control unit 1028. The camera head control unit 1028 receives the information of phase detection produced by the phase detection unit 1024 and uses them to control the lens unit 1025 for focusing. Incidentally, the system structure may be modified such that the phase detection unit 1024 is contained in the CCU 1051. In addition, the system structure may also be modified such that phase detection is carried out as part of image processing in the image processing unit 1083.

The communication unit 1026 is composed of various parts for transmission and reception of various kinds of information to and from the CCU 1051. Moreover, the communication unit 1026 transmits image signals (in the form of RAW data) from the imaging unit 1027 to the CCU 1051 through the transmission cable 1091. The transmission of the image signals should preferably be performed through optical communication so that the image of the part under operation is displayed with a low latency.

The foregoing optical communication is essential for real-time image display because the operator 1071 needs to perform operation safely and surely while watching the affected part. To achieve the optical communication, it is necessary for the communication unit 1026 to be equipped with a photoelectric converting module that converts electrical signals into optical signals. After conversion into optical signals by the photoelectric converting module, the image signals are transmitted to the CCU 1051 through the transmission cable 1091.

In addition, the communication unit 1026 receives from the CCU 1051 the control signals to control the driving of the camera head 1023. The control signals include various kinds of information such as the one to specify the frame rate of images, the one to specify the exposure value, and/or the one to specify the magnification ratio and focus distance of images. Moreover, the communication unit 1026 dispatches the thus received control signals to the camera head control unit 1028.

Alternatively, the optical communication may be applied to the transmission of the control signals from the CCU 1051. In this case, the communication unit 1026 may be provided with a photoelectric conversion module to convert optical signals into electrical signals so that the control signals are converted into the electrical signals by the photoelectric conversion module and the converted signals are transmitted to the camera head control unit 1028.

Incidentally, the above-mentioned frame rate and photographing conditions (such as exposure, magnification ratio, and focusing) are set up automatically by the CCU 1051 and the control unit 1085 based on the image signals captured. This is accomplished by the AE (Auto Exposure) function, the AF (Auto Focus) function, and the AWB (Auto White Balance) function, which are built into the endoscope 1020.

The camera head unit 1028 controls the driving of the camera head 1023 according to the control signals received from the CCU 1051 through the communication unit 1026. For example, the camera head control unit 1028 controls the driving of the imaging element of the imaging unit 1027 according to information that specifies the frame rate of images and/or specifies exposure for imaging. Also, the camera head control unit 1028 moves appropriately the focusing lens and zooming lens of the lens unit 1025 through the driving unit 1029 according to the information to specify the magnification ratio and the focus distance. In addition, the camera head control unit 1028 may have the function to store the information to identify the lens barrel 1021 and the camera head 1023.

Incidentally, the lens unit 1025 and the imaging unit 1027 may be placed in an airtight and waterproof structure so that the camera head 1023 resists sterilization in an autoclave.

The following is a description of the CCU 1051. The communication unit 1081 is an aggregate of equipment to send and receive various kinds of information to and from the camera head 1023. That is, the communication unit 1081 receives image signals from the camera head 1023 through the transmission cable 1091. The image signals should preferably be in the form suitable for optical communication as mentioned above. In this case, the communication unit 1081 is provided with a photoelectric conversion module which converts optical signals into electrical signals. The communication unit 1081 transmits the converted image signals to the image processing unit 1083.

Further, the communication unit 1081 transmits control signals to the camera head 1023 for its driving. Transmission of the control signals may be performed by means of optical communication.

The image processing unit 1083 performs various kinds of image processing on the image signals (in the form of RAW data) transmitted from the camera head 1023. The image processing include any known ones, such as development, quality improvement (e.g., band enhancement, resolution increase, NR (Noise Reduction), and/or hand shake correction), and/or enlargement (electronic zooming). Also, the image processing unit 1083 performs demodulation on the image signals for AE, AF, and AWB.

The image processing unit 1083 includes various processors such as CPU and GPU. These processors function according to prescribed programs so as to perform the image processing and demodulation mentioned above. Incidentally, in the case where the image processing unit 1083 includes a plurality of GPU, the image processing unit 1083 divides information of the image signals into several pieces for parallel image processing by these GPUs.

The control unit 1085 so controls the endoscope 1020 as to take photographs of the affected part and display the photographed images. For example, the control unit 1085 generates signals to control the camera head 1023. In the case where the user has previously entered photographing conditions, the control signals may incorporate them into the control signals. Alternatively, in the case where the endoscope 1020 is incorporated with AE function, AF function, and AWB function, the control unit 1085 calculates the optimal exposure value, focal distance, and white balance according to the result of demodulation by the image processing unit 1083, and then generates control signals.

Moreover, the control unit 1085 causes the display device 1053 to display the image of the affected part according to the image signals which have undergone image processing by the image processing unit 1083. In this step, the control unit 1085 recognizes various objects in the image of the affected part by means of various image recognition techniques.

For example, the control unit 1085 detects the edge shape and color of the object contained in the image of the effected part, thereby allowing the operator to recognize the tools (such as forceps), specific part of the living body, bleeding, and mist that appears when the energy treating tool is used. The control unit 1085 causes the display device 1053 to display the image of the affected part in such a way that various kinds of operation assisting information are superimposed on the image of the affected part. The superimposed information helps the operator 1071 to carry out safe and sure operation.

The transmission cable 1091 to connect together the camera head 1023 and the CCU 1051 may be an electrical signal cable suitable for electric communication or an optical fiber cable suitable for optical communication or a combination thereof.

FIG. 18 depicts a system in which the transmission cable 1091 is employed for wire communication; however, wireless communication may be possible between the camera head 1023 and the CCU 1051. Wireless communication obviates the necessity for the transmission cable to be laid in the operation room. The absence of the transmission cable 1091 eliminates the possibility of the medical staff being caught by the cable.

The foregoing is a description of the technique disclosed herein which is applied to the endoscopic operation system 1010.

Note that the technique disclosed herein is applied to not only the endoscopic operation system 1010 mentioned above but also any other systems, such as soft endoscope system for examination and microscopic operation system.

<Applications of Image Sensor>

Figure 19:
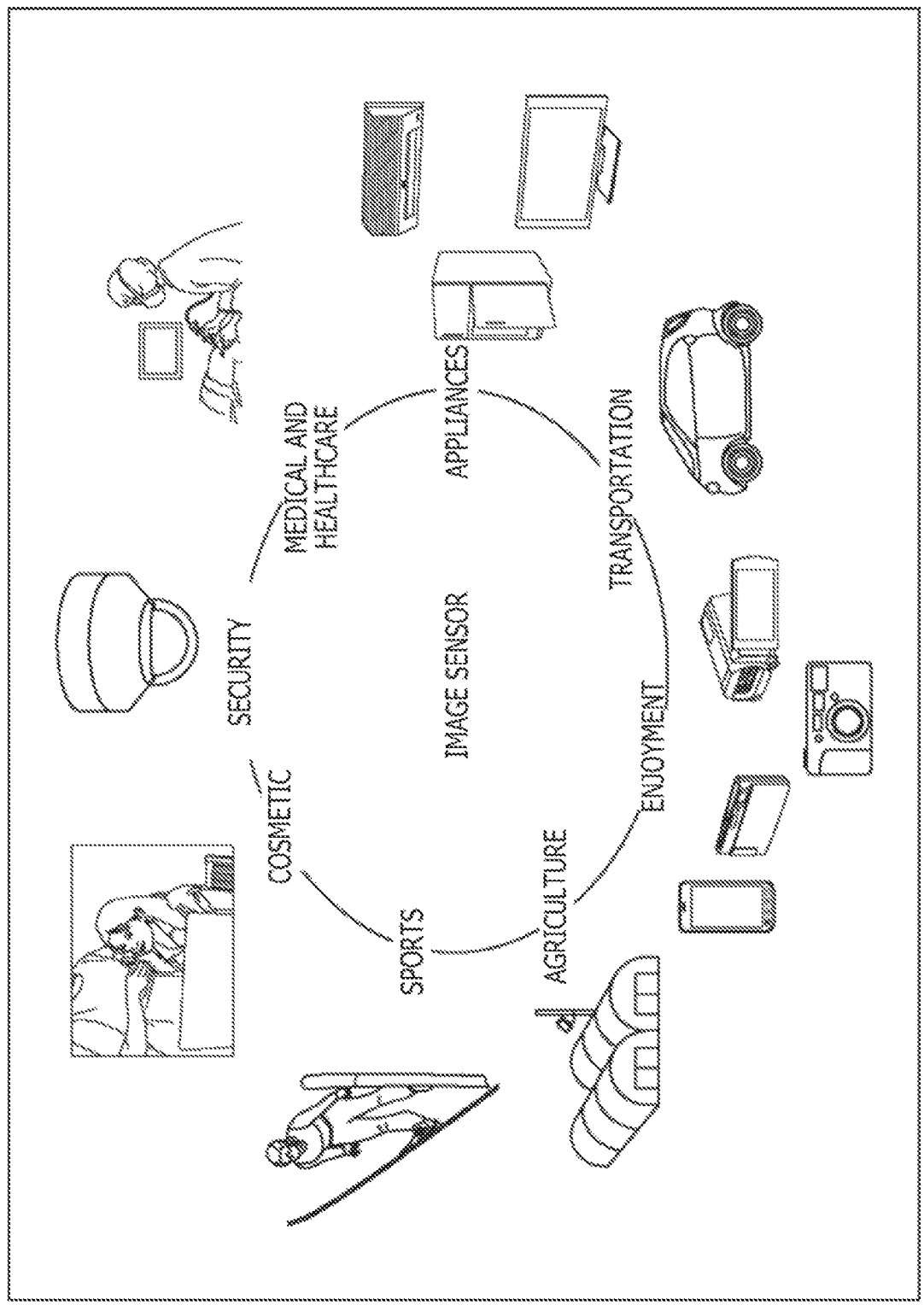
FIG. 19 is a diagram to explain the applications of an image sensor.

The CMOS image sensor 100 mentioned above will find use in various fields as depicted in FIG. 19.

The CMOS image sensor 100 may be applied to sensing devices that capture visible light, infrared light, ultraviolet light, and X-rays, as exemplified below.

Image capturing apparatus, such as digital camera and portable terminal with photographing function, which produce images for enjoyment.

Transportation apparatus, such as on-vehicle sensors to photograph the front, rear, surrounding, and inside of a car for the purpose of safe driving (automatic stopping) and driver's state recognition, surveillance camera to monitor running cars and roads, and distance sensor to measure the distance between cars.

Apparatus to control appliances, such as TV, refrigerator, and air conditioner, in compliance with the photographed image of the user's gesture.

Medical and healthcare apparatus, such as endoscope and camera to photograph blood vessel with infrared light.

Security apparatus, such as surveillance camera and face recognition camera.

Cosmetic apparatus, such as skin examining tool and scalp observing microscope.

Sporting apparatus, such as action camera and wearable camera.

Agricultural apparatus, such as cameras to monitor the crops and farms.

The imaging apparatus 10 may be one in which either electrons or holes function as the signal charge.

The technique disclosed herein can be applied not only to the imaging apparatus which detects the amount of incident visible light, thereby producing images, but also to any other various imaging apparatus (such as fingerprint sensor) which detect the distribution of physical quantity such as pressure and static capacity, thereby producing images.

The technique disclosed herein can be applied to any other semiconductor apparatus having semiconductor integrated circuits.

The embodiments disclosed herein do not have their scope restricted to what is mentioned above. They will be variously modified within the scope of the present disclosure.

For example, the above-mentioned embodiments may be combined partly or all together.

Note that the effects of the specification mentioned above are mere examples, and the present specification may produce any other effects than mentioned above.

Note that the present disclosure may be embodied as follows.

(1)

An imaging element including:

a first light-receiving part that receives incident light entering through a first on-chip lens;

a first phase detecting pixel which is placed between the first on-chip lens and the first light-receiving part and which has a shading film to limit an amount of light reaching the first light-receiving part; and a second phase detecting pixel which has a second light-receiving part to receive incident light entering through a second on-chip lens, with the second light-receiving part being divided into a plurality of light-receiving regions.

(2)

The imaging element as defined in Paragraph (1) above, in which the first phase detecting pixel is arranged in a peripheral region of a pixel array part, and the second phase detecting pixel is arranged in any other region than the peripheral region of the pixel array part.

(3)

The imaging element as defined in Paragraph (1) above, in which the first phase detecting pixel is arranged such that density of arrangement gradually increase in going from a central region to the peripheral region of the pixel array part.

(4)

The imaging element as defined in any one of Paragraphs (1) to (3) above, in which the first light-receiving part is divided into a plurality of light-receiving regions in the same way as the second light-receiving part.

(5)

The imaging element as defined in Paragraph (4) above, in which the light-receiving region is divided in vertical or lateral direction.

(6)

The imaging element as defined in any one of Paragraphs (1) to (5) above, in which the first phase detecting pixel and the second phase detecting pixel detect the phase differences in different directions.

(7)

The imaging element as defined in any one of Paragraphs (1) to (5) above, in which the first phase detecting pixel includes a pixel to detect phase difference in the horizontal direction and a pixel to detect phase difference in the vertical direction.

(8)

The imaging element as defined in any one of Paragraphs (1) to (3) above, in which the first light-receiving part has one light-receiving region.

(9)

The imaging element as defined in any one of Paragraphs (1) to (8) above, in which the first phase detecting pixel has a color filter thereon and the second phase detecting pixel has a color filter thereon, with the color filters being of the same color.

(10)

The imaging element as defined in Paragraphs (9) above, in which the color filters are so arranged as to constitute Bayer layout for red, green, and blue, and the first phase detecting pixel is arranged on the second phase detecting pixel such that blue color overlaps with green color.

(11)

The imaging element as defined in any one of Paragraphs (1) to (10) above, in which an area in which the second phase detecting pixel detects the phase difference depending on optical conditions of the lens is set by optical conditions of the lens, the second phase detecting pixel detects the phase difference inside the set area, and the first phase detecting pixel detects the phase difference outside the set area.

(12)

An imaging apparatus including:

an imaging element having a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

(13)

Electronic equipment including:

an imaging element having a first light-receiving part that receives incident light entering through a first on-chip lens, a first phase detecting pixel which is placed between the first on-chip lens and the first light-receiving part and which has a shading film to limit an amount of light reaching the first light-receiving part, and a second phase detecting pixel which has a second light-receiving part to receive incident light entering through a second on-chip lens, with the second light-receiving part being divided into a plurality of light-receiving regions.

REFERENCE SIGNS LIST

100 CMOS image sensor, 111 Pixel array part, 201 Central region, 202 Peripheral region, 211 Pixel, 231, 232 Light-receiving region, 251 On-chip lens, 311 Shading film, 1010 Endoscopic operation system, 1027 Imaging unit, 1030 Site of operation, 1083 Image processing unit, 1085 Control unit

The invention claimed is:

1. An imaging element, comprising:
   a first light-receiving part configured to receive first incident light through a first on-chip lens;
   a first phase detecting pixel between the first on-chip lens and the first light-receiving part, wherein the first phase detecting pixel has a shading film to limit an amount of light that reaches the first light-receiving part; and
   a second phase detecting pixel that comprises a second light-receiving part configured to receive second incident light through a second on-chip lens, wherein the second light-receiving part comprises a first plurality of light-receiving regions.

2. The imaging element as defined in claim 1, wherein
   the first phase detecting pixel is in a peripheral region of a pixel array part of the imaging element, and
   the second phase detecting pixel is in a region other than the peripheral region of the pixel array part.

3. The imaging element as defined in claim 1, wherein a density of the first phase detecting pixel gradually increases from a central region of a pixel array part of the imaging element to a peripheral region of the pixel array part.

4. The imaging element as defined in claim 1, wherein the first light-receiving part comprises a second plurality of light-receiving regions.

5. The imaging element as defined in claim 4, wherein the first plurality of light-receiving regions and the second plurality of light-receiving regions are in at least one of a vertical direction or a lateral direction.

6. The imaging element as defined in claim 1, wherein the first phase detecting pixel and the second phase detecting pixel are configured to detect phase differences in different directions.

7. The imaging element as defined in claim 1, wherein the first phase detecting pixel includes:
   a first pixel configured to detect a phase difference in a horizontal direction; and
   a second pixel configured to detect the phase difference in a vertical direction.

8. The imaging element as defined in claim 1, wherein the first light-receiving part has a light-receiving region.

9. The imaging element as defined in claim 1, wherein
   the first phase detecting pixel has a first color filter,
   the second phase detecting pixel has a second color filter, and
   the first color filter and the second color filter are of a same color.

10. The imaging element as defined in claim 9, wherein
    the first color filter and the second color filter are so arranged as to constitute Bayer layout for red, green, and blue, and
    the first phase detecting pixel is arranged on the second phase detecting pixel such that blue color overlaps with green color.

11. The imaging element as defined in claim 1, wherein
    the second phase detecting pixel is configured to detect a phase difference inside an area, wherein the area is set based on optical conditions of at least one of the first on-chip lens or the second on-chip lens, and
    the first phase detecting pixel is configured to detect the phase difference outside the area.

12. An imaging apparatus, comprising:
    an imaging element that comprises:
    a first light-receiving part configured to receive first incident light through a first on-chip lens;
    a first phase detecting pixel between the first on-chip lens and the first light-receiving part, wherein the first phase detecting pixel has a shading film to limit an amount of light that reaches the first light-receiving part; and a second phase detecting pixel that comprises a second light-receiving part configured to receive second incident light through a second on-chip lens, wherein the second light-receiving part comprises a plurality of light-receiving regions.

13. An electronic equipment, comprising:

an imaging element that comprises:
- a first light-receiving part configured to receive first incident light through a first on-chip lens;
- a first phase detecting pixel between the first on-chip lens and the first light-receiving part, wherein the first phase detecting pixel has a shading film to limit an amount of light that reaches the first light-receiving part; and
- a second phase detecting pixel that comprises a second light-receiving part configured to receive second incident light through a second on-chip lens, wherein the second light-receiving part being divided comprises a plurality of light-receiving regions.

* * * * *